(12) United States Patent
Rieger et al.

(10) Patent No.: US 7,875,951 B2
(45) Date of Patent: Jan. 25, 2011

(54) SEMICONDUCTOR WITH ACTIVE COMPONENT AND METHOD FOR MANUFACTURE

(75) Inventors: Walter Rieger, Arnoldstein (AT); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 580 days.

(21) Appl. No.: 11/955,032

(22) Filed: Dec. 12, 2007

(65) Prior Publication Data
US 2009/0152667 A1 Jun. 18, 2009

(51) Int. Cl.
*H01L 29/40* (2006.01)
(52) U.S. Cl. ............... 257/488; 257/330; 257/E29.052; 257/E29.118
(58) Field of Classification Search ........... 257/330, 257/488, E29.052, E29.118
See application file for complete search history.

(56) References Cited

U.S. PATENT DOCUMENTS

| | | | | |
|---|---|---|---|---|
| 3,446,995 | A * | 5/1969 | Castrucci | 327/530 |
| 4,754,310 | A | 6/1988 | Coe | |
| 5,216,275 | A | 6/1993 | Chen | |
| 5,438,215 | A | 8/1995 | Tihanyi | |
| 5,572,048 | A * | 11/1996 | Sugawara | 257/132 |
| 7,161,208 | B2 * | 1/2007 | Spring et al. | 257/328 |
| 7,655,974 | B2 * | 2/2010 | Shimada et al. | 257/330 |
| 7,671,408 | B2 * | 3/2010 | Denison | 257/330 |
| 7,679,136 | B2 * | 3/2010 | Kachi et al. | 257/330 |
| 2004/0070029 | A1 * | 4/2004 | Robb et al. | 257/332 |
| 2005/0145936 | A1 * | 7/2005 | Polzl et al. | 257/341 |
| 2007/0272978 | A1 * | 11/2007 | Mauder et al. | 257/330 |
| 2008/0230812 | A1 * | 9/2008 | Disney et al. | 257/272 |

FOREIGN PATENT DOCUMENTS

DE 4309764 A1 9/1994
DE 19961297 A1 6/2001

* cited by examiner

*Primary Examiner*—Allan R Wilson
(74) *Attorney, Agent, or Firm*—Dicke, Billig & Czaja, PLLC

(57) ABSTRACT

A semiconductor with active component and method for manufacture. One embodiment provides a semiconductor component arrangement having an active semiconductor component and a semiconductor body having a first semiconductor zone, a third semiconductor zone, and also a drift zone arranged between the first semiconductor zone and the third semiconductor zone. A patterned fourth semiconductor zone doped complementarily to the drift zone is arranged in the drift zone. A potential control structure is provided, which is connected to the patterned fourth semiconductor zone. The potential control structure is designed to connect the patterned fourth semiconductor zone, in the off state of the semiconductor component, to an electrical potential lying between the electrical potential of the first semiconductor zone and the electrical potential of the third semiconductor zone.

23 Claims, 22 Drawing Sheets

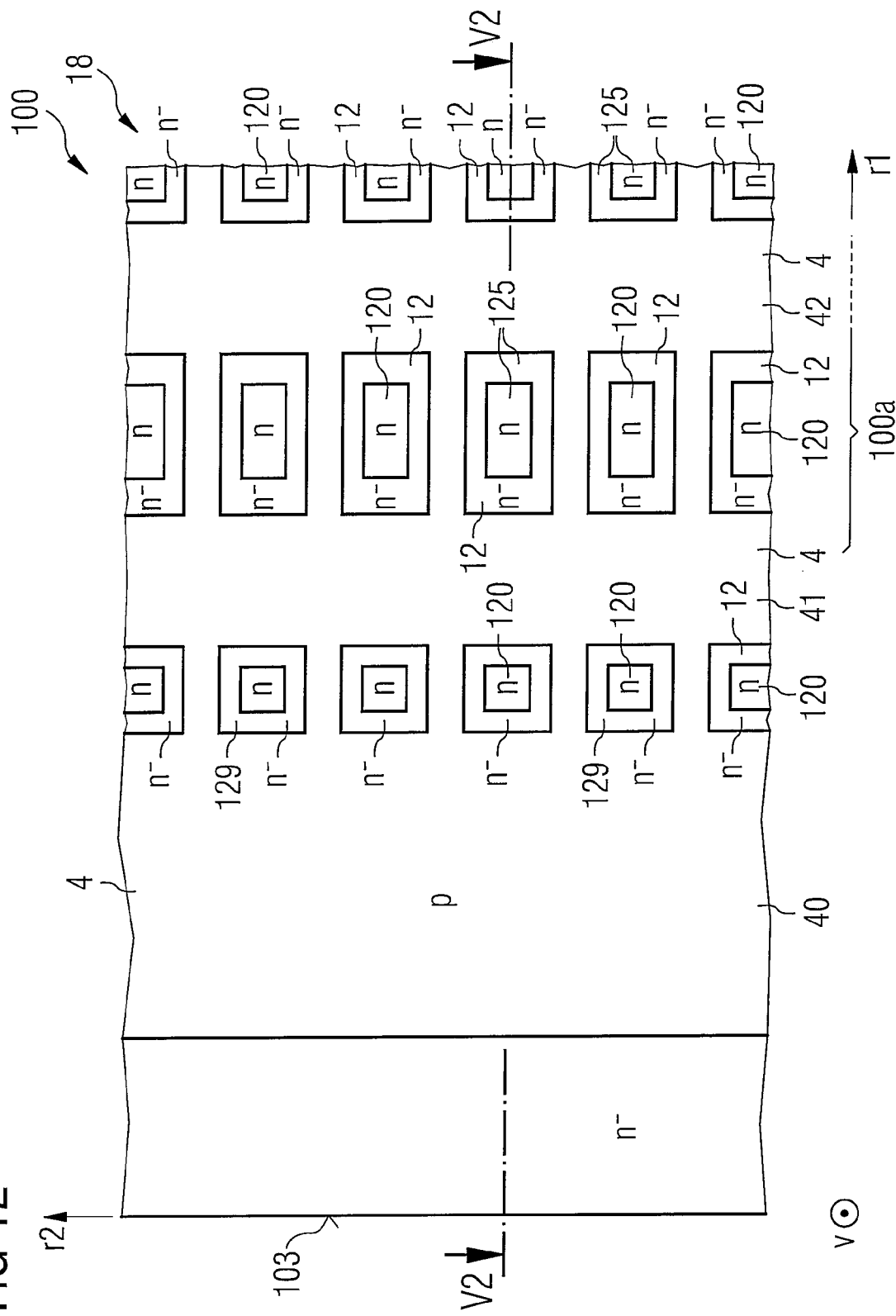

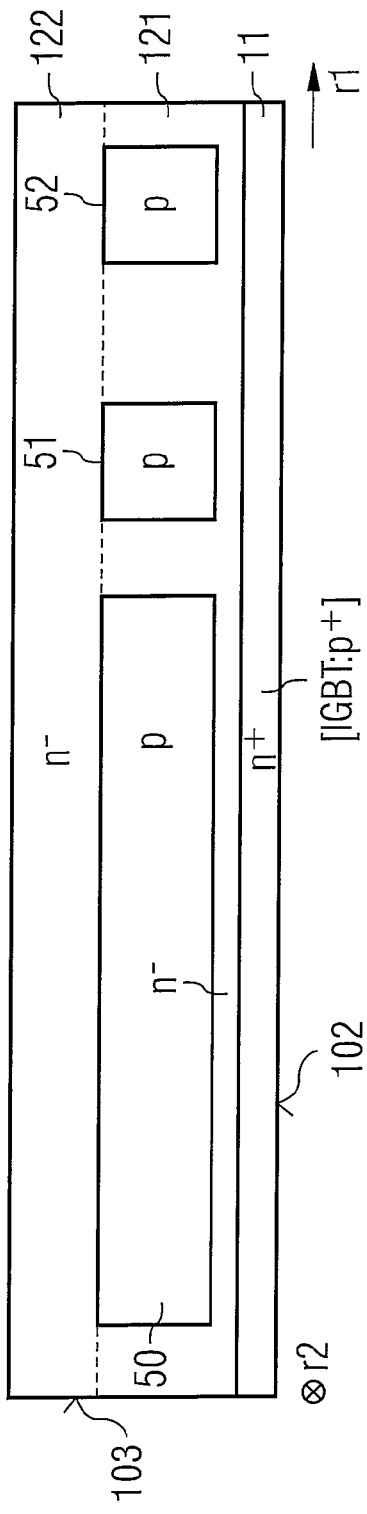
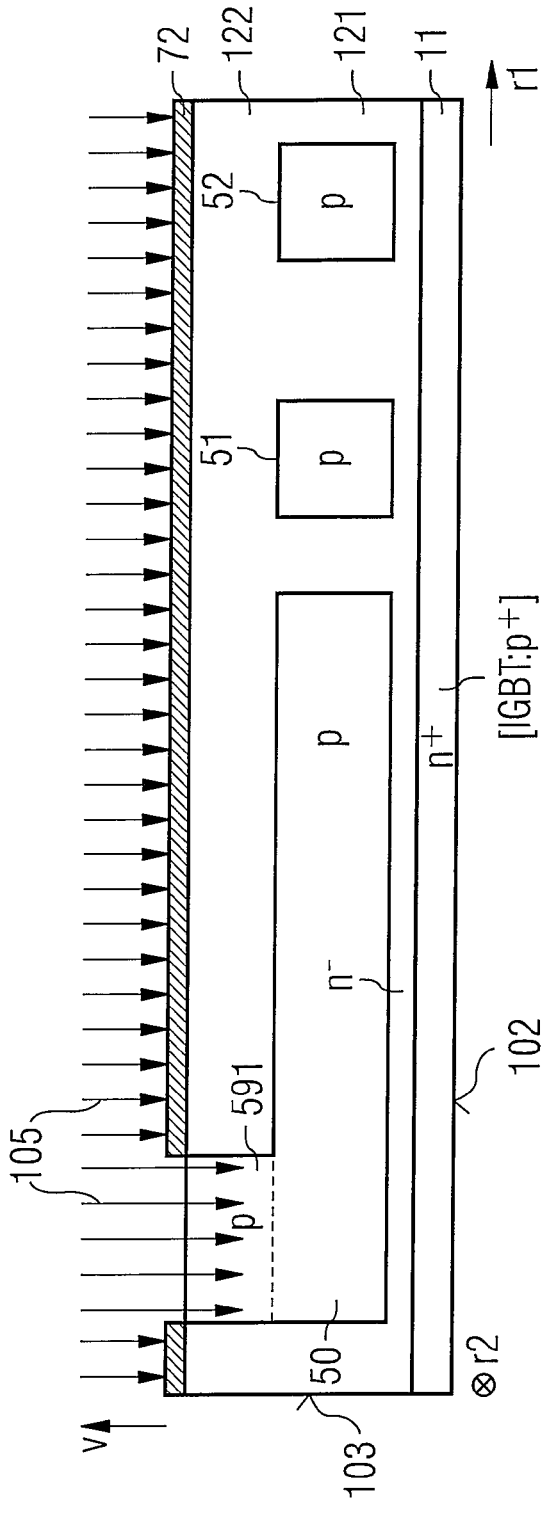
FIG 13D
FIG 13E

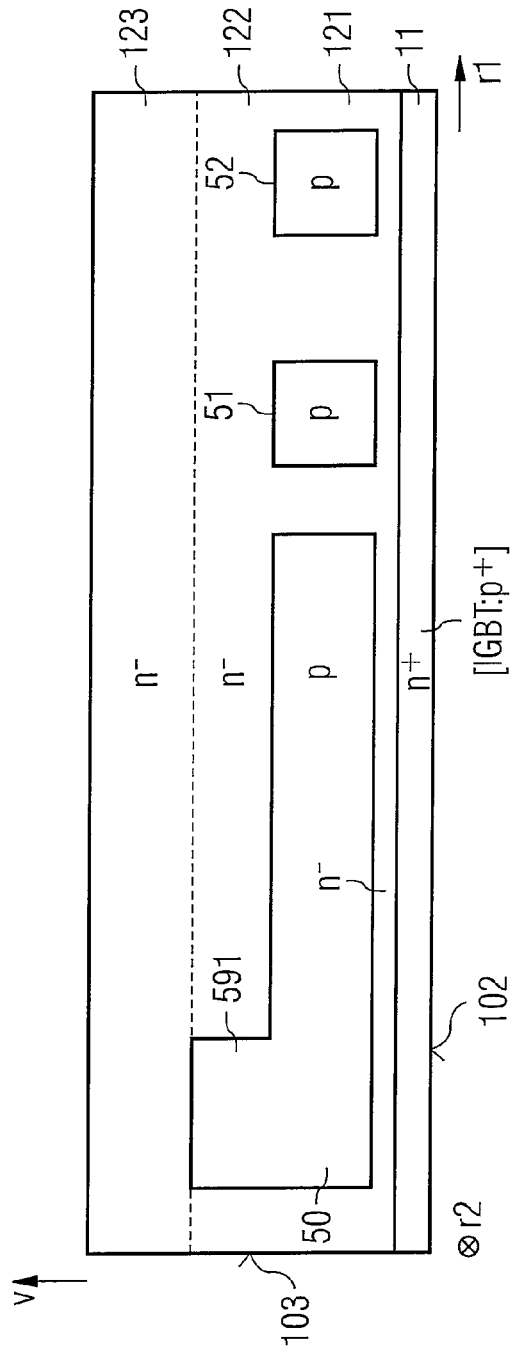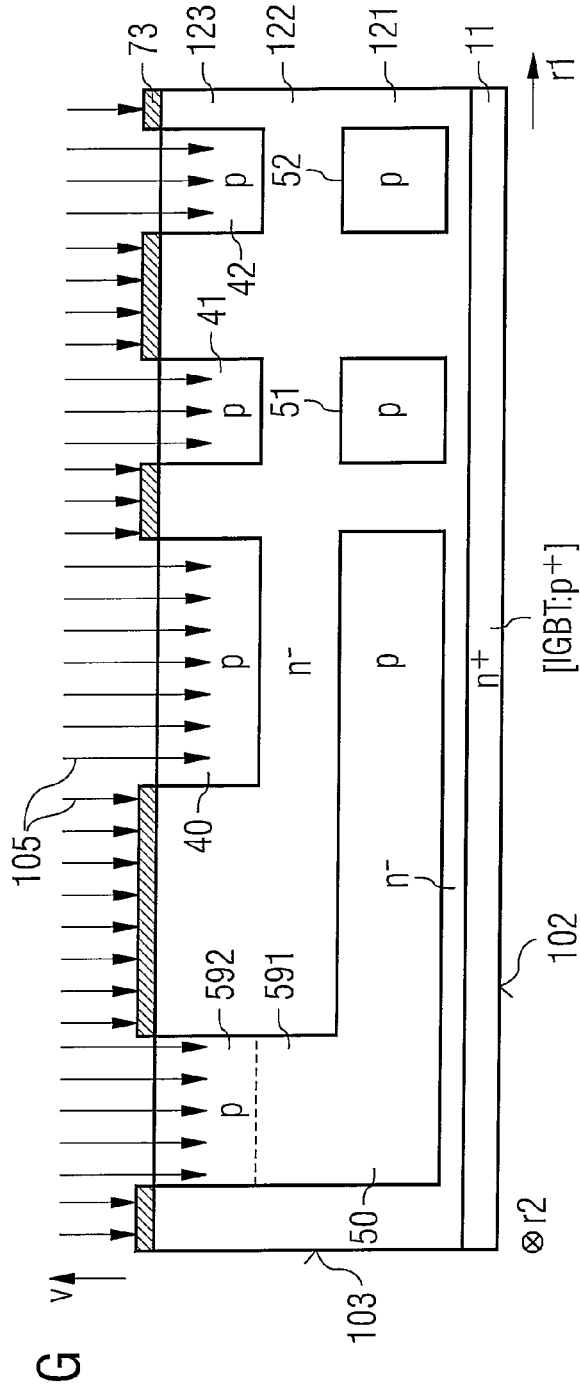
FIG 13F
FIG 13G

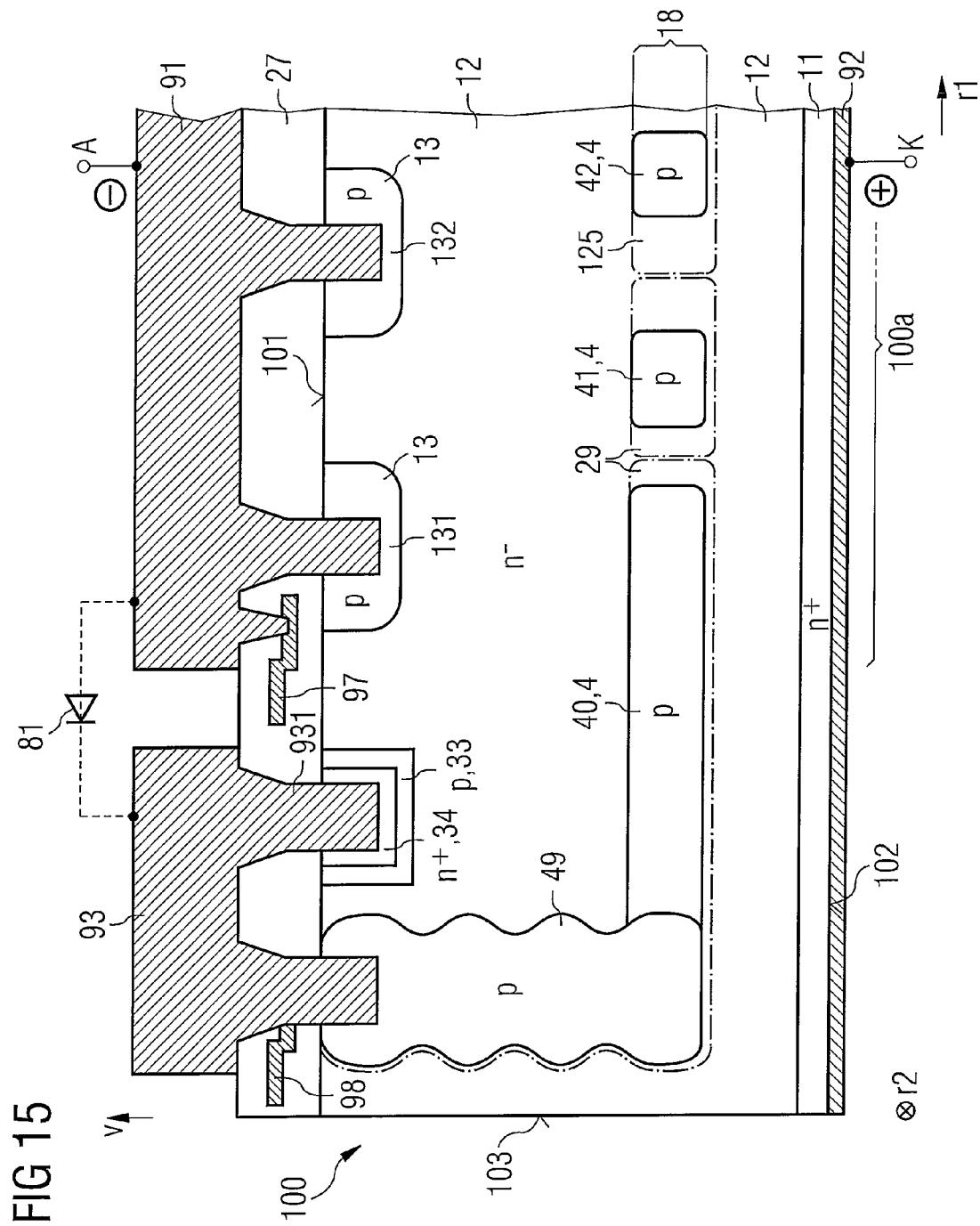

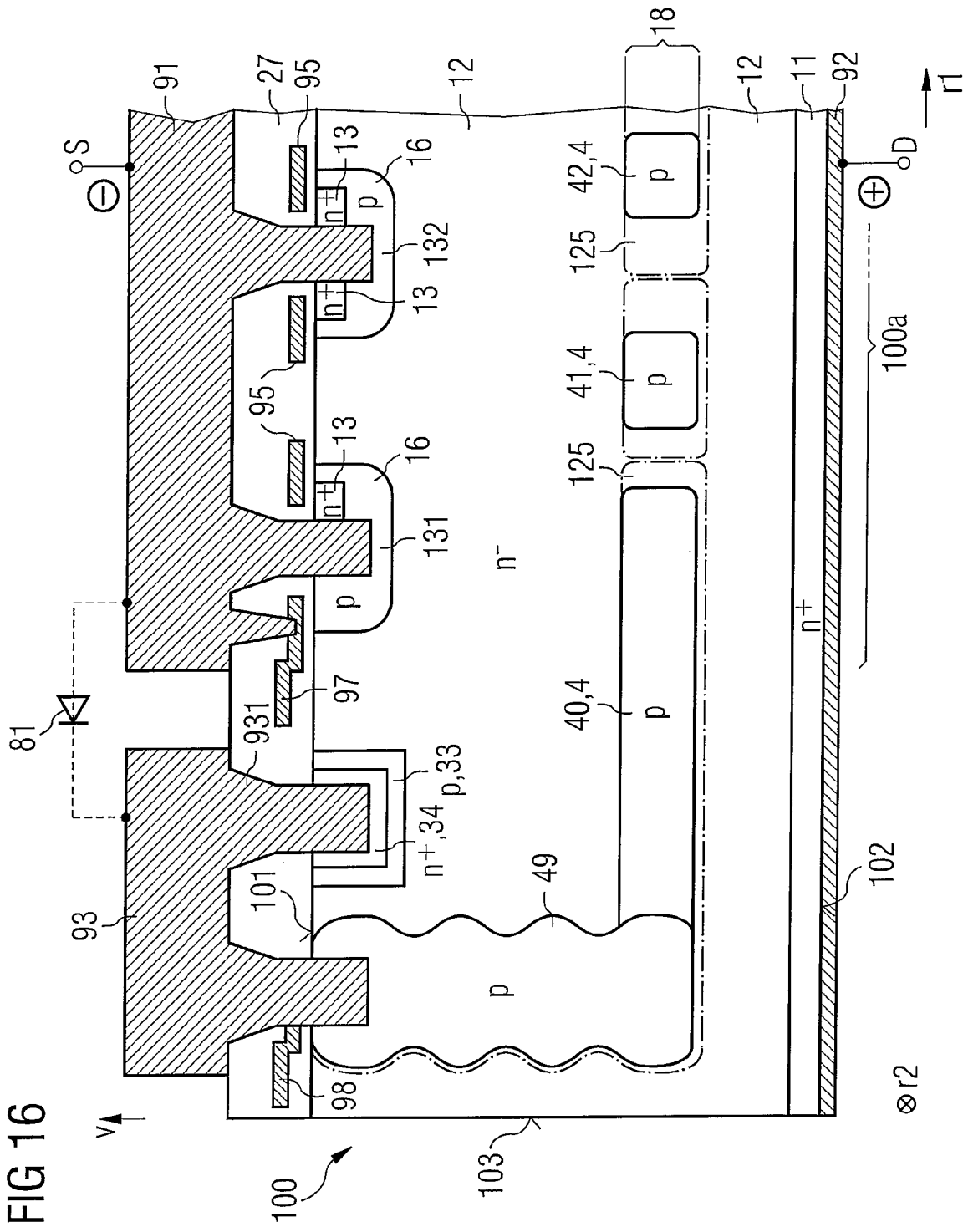

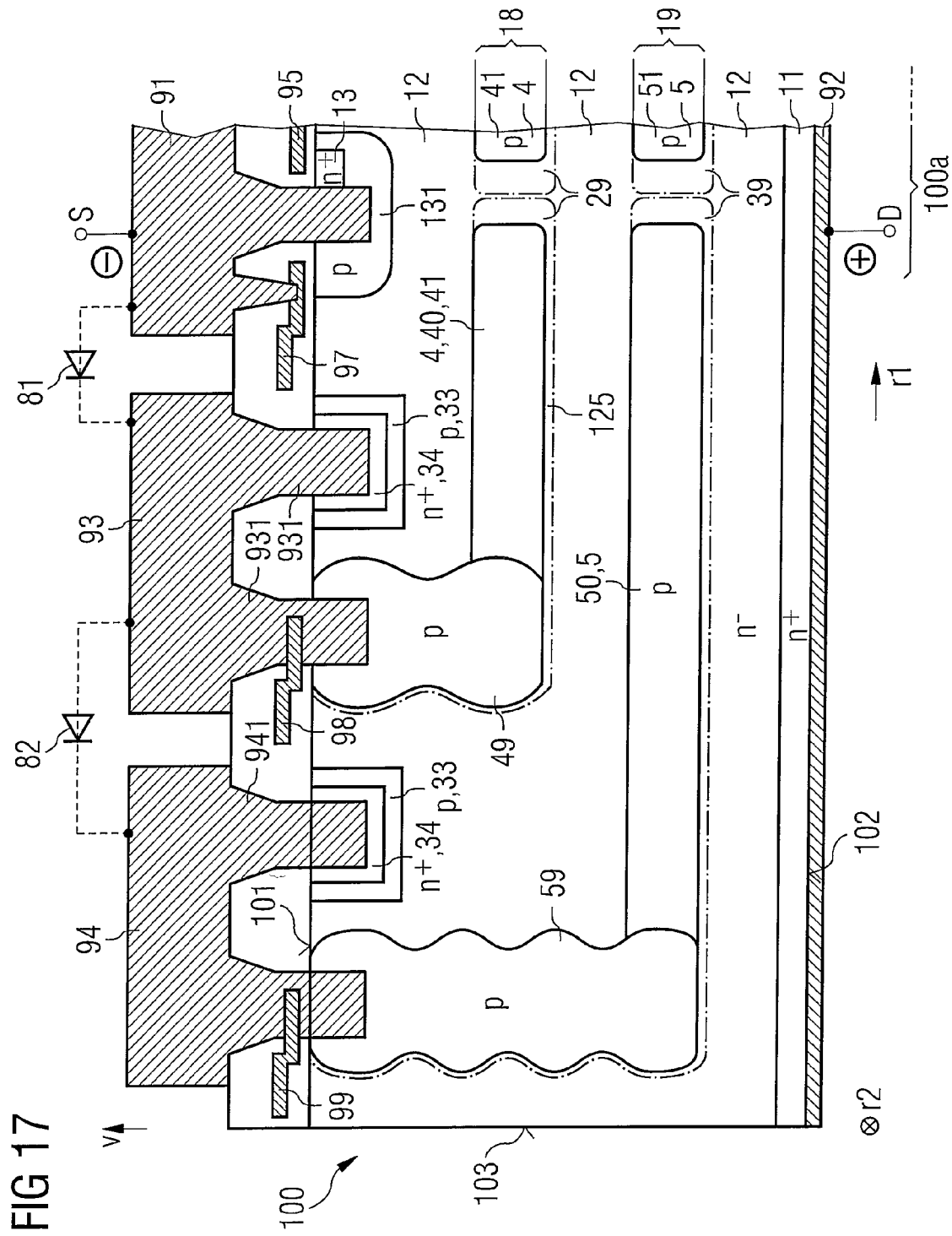

SEMICONDUCTOR WITH ACTIVE COMPONENT AND METHOD FOR MANUFACTURE

BACKGROUND

In the off state, power semiconductor components must take up high voltages, but are nevertheless intended to have a low on resistance. The reverse voltage strength and the on resistance of a power semiconductor component are competing variables, however, that is to say that the on resistance of a power semiconductor component generally also rises with the reverse voltage strength of the component. Therefore, there is a need for power semiconductor components which have a lowest possible on resistance for a predetermined reverse voltage strength.

SUMMARY

One or more embodiments described below relate to a semiconductor component arrangement including an active semiconductor component, which can assume an on state and an off state. The semiconductor component has a semiconductor body having a first semiconductor zone, a third semiconductor zone, and also a second semiconductor zone of a first conduction type, the second semiconductor zone being arranged between the first semiconductor zone and the third semiconductor zone and being formed as a drift zone. A patterned fourth semiconductor zone of a second conduction type, which is complementary to the first conduction type, is arranged in the second semiconductor zone. Furthermore, a potential control structure is provided, which is connected to the patterned fourth semiconductor zone.

BRIEF DESCRIPTION OF THE DRAWINGS

Various examples are explained in more detail below with reference to figures. Said The figures and the associated description serve to afford a better understanding of the basic principle. In the figures, identical reference symbols designate identical elements with the same meaning. For reasons of representability, the figures shown illustrated are not true to scale.

FIG. 12 illustrates a horizontal section through an edge portion of the trench transistor illustrated in FIG. 11, in a plane B2, perpendicular to the vertical direction, through the patterned semiconductor zone.

FIG. 15 illustrates a vertical section through a planar diode with an edge termination having a field plate structure, and a patterned anode.

FIG. 16 illustrates a vertical section through a planar transistor in which the potential control structure includes a zener diode integrated into the semiconductor body of the diode.

FIG. 17 illustrates a vertical section through an edge portion of a planar transistor in the drift zone of which are arranged two patterned semiconductor zones which are doped complementarily to the drift zone and are at a distance from one another.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
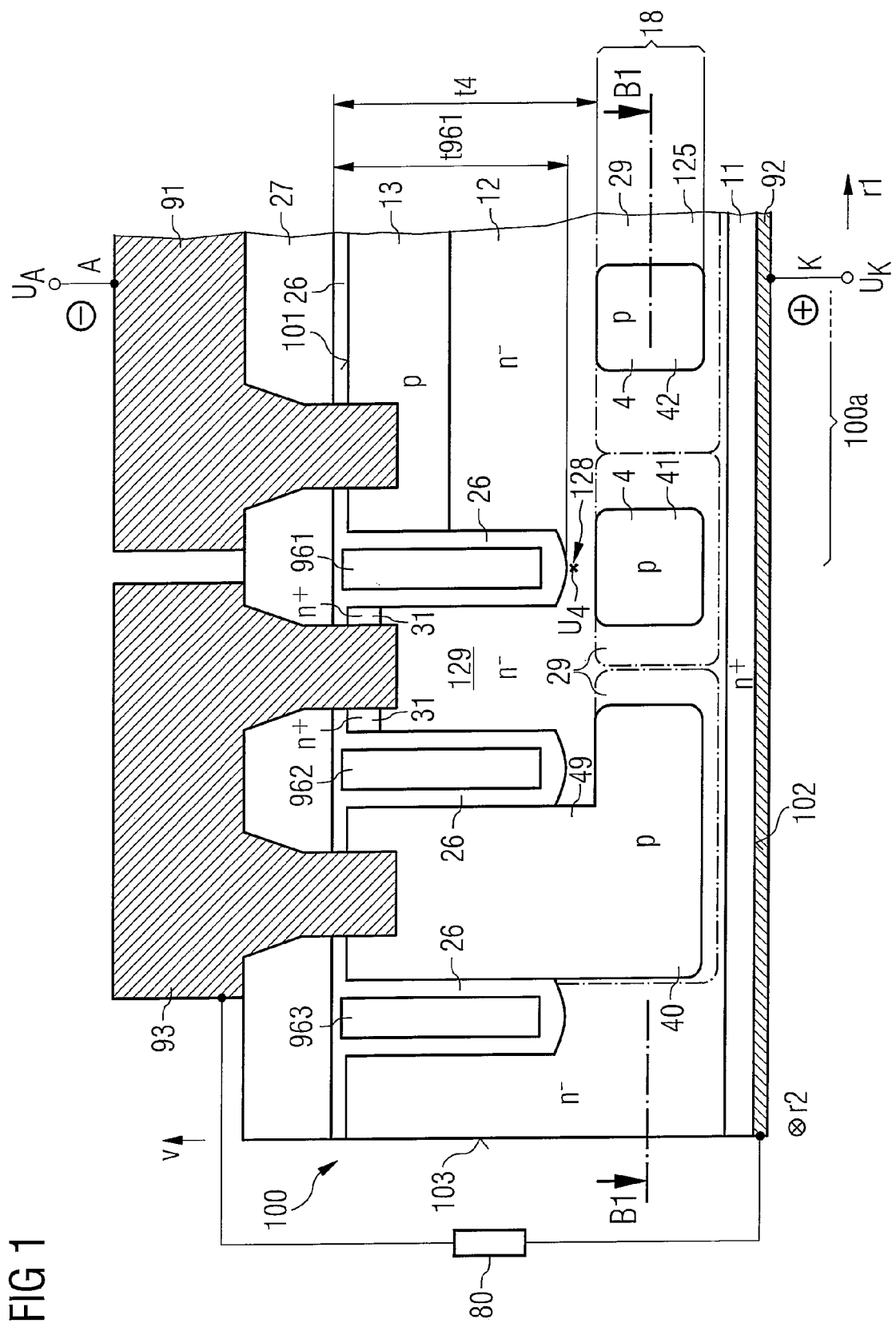
FIG. 1 illustrates a vertical section through a vertical semiconductor component formed as a diode with a patterned semiconductor zone.
Figure 3:
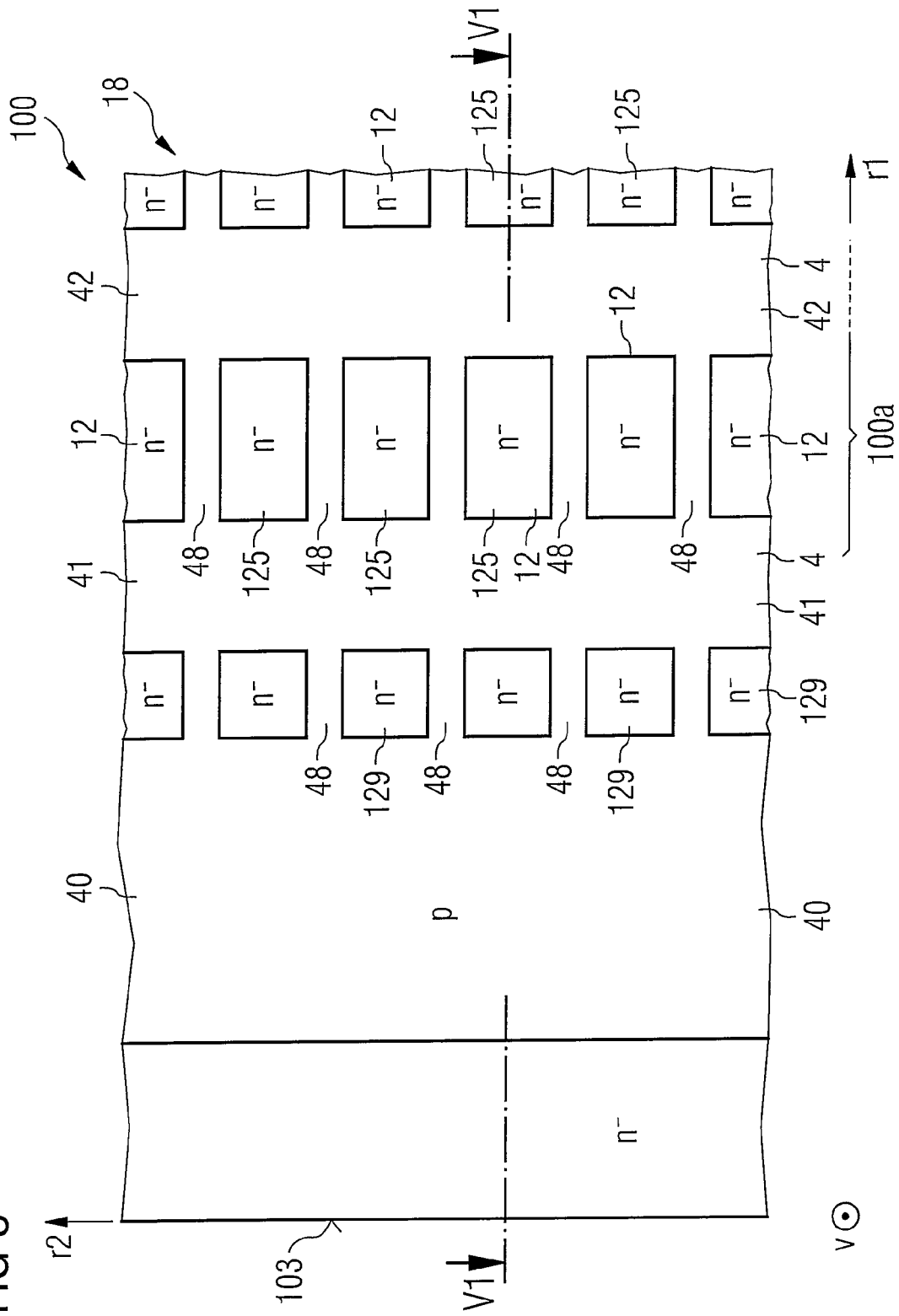
FIG. 3 illustrates a horizontal section through an edge portion of the trench transistor illustrated in FIG. 2, in a sectional plane B1, perpendicular to the vertical direction, through the patterned semiconductor zone.

FIG. 1 illustrates a vertical section through a portion near the edge of a semiconductor component formed as a diode, in a sectional plane V1, which can be seen from FIG. 3. The diode includes a semiconductor body 100 having a front side 101 and a rear side 102 opposite the front side 101 in a vertical direction v. Arranged in the semiconductor body 100, proceeding from the rear side 102 toward the front side 101, are a heavily n-doped first semiconductor zone 11, a weakly n-doped second semiconductor zone 12 formed as a drift zone, and a p-doped third semiconductor zone 13.

The diode furthermore includes an active component region 100a, which is at a distance from the lateral edge 103 of the semiconductor body 100 and which extends over the entire component in the vertical direction v and over the same region as the third semiconductor zone 13 and/or the second semiconductor zone 12 in a first lateral direction r1, perpendicular to the vertical direction v.

Furthermore, a first electrode 91, which is formed as an anode electrode, is applied to the front side 101, the first electrode being electrically connected to the third semiconductor zone 13. Dielectric layers 26 and 27 are additionally arranged between the semiconductor body 100 and the source electrode 91. An electrode 92, which is formed as a cathode electrode, is applied to the rear side 102, the electrode being electrically connected to the first semiconductor zone 11. An anode terminal A connected to the anode electrode 91 and a cathode terminal D connected to the cathode electrode 92 are provided for external circuitry connection of the diode.

A patterned fourth semiconductor zone 4, which is doped complementarily to the drift zone 12, is embedded into the drift zone 12, and extends over a layer 18 of the semiconductor body 100 in the vertical direction v and is at a distance from the front side 101 and also from the pn junction formed between the second semiconductor zone 12 and the third semiconductor zone 13.

In the example illustrated, the patterned fourth semiconductor zone 4 has portions 40, 41, 42, and also further portions, not illustrated, which are arranged in the active component region 100a at a distance from one another in one of the first lateral direction r1 and in a second lateral direction r2, perpendicular to the vertical direction v and to the first lateral direction r1, such that a portion 125 of the drift zone 12 is respectively arranged between two adjacent portions from among the portions 40, 41, 42. The portions 40, 41, 42 and also the further portions (not illustrated) of the patterned fourth semiconductor zone 4 are electrically conductively connected to one another and can be formed for example as a continuous p-doped semiconductor region.

In principle, such a patterned fourth semiconductor zone 4, irrespective of the type of component, in the off state of the component, is not floating but rather is connected to an electrical potential. Such a patterned fourth semiconductor zone 4 can be designed in such a way that it is depleted at a predetermined reverse voltage present at the component. As an alternative to this, however, it can also be doped so heavily that it is not depleted at the predetermined reverse voltage present. The doping and the geometry of such a patterned fourth semiconductor zone 4 are chosen such that the second semiconductor zone 12, in the off state of the component, no longer contains any free charge carriers at least in a layer 18 that also includes the patterned fourth semiconductor zone 4.

In the illustrated off state of the diode, that is to say if the cathode terminal K carries an electrical potential $U_K$ that is higher than an electrical potential $U_A$ present at the anode terminal A, the patterned fourth semiconductor zone 4 is fed an electrical potential $U_4$ lying between the electrical potentials $U_A$ and $U_K$. On account of the potential differences between the portions 40, 41, 42 and the second semiconductor zone 12, space charge zones 29 form, when the diode is in the off state, at the pn junctions between the drift zone 12 and the portions 40, 41, 42 of the patterned fourth semiconductor zone 4, which space charge zones pinch off a channel formed in the portions 125 of the drift zone 12. The space charge zones 29 serve to largely deplete the second semiconductor zone 12 in the layer 18 of the patterned fourth semiconductor zone 4 when the component is in the off state, thereby increasing the blocking capability of the diode in comparison with a diode which is constructed identically but which does not have such a patterned fourth semiconductor zone 4. Moreover, the second semiconductor zone 12 of a component having such a patterned fourth semiconductor zone 4 can be doped more heavily in comparison with a conventional component with the same maximum reverse voltage, whereby the on resistance of the diode decreases.

In the off state of the diode illustrated, the patterned fourth semiconductor zone 4 is connected to an electrical potential $U_4$ which the second semiconductor zone 12 has at a location 128 arranged nearer the front side 101 and nearer the pn junction formed between the second semiconductor zone 12 and the third semiconductor zone 13 than the patterned fourth semiconductor zone 4. In the case of the exemplary embodiment in accordance with FIG. 1, the location 128 is arranged directly below the dielectric 26 of a first field electrode 961 arranged in a trench, which electrode terminates the active component region 100a toward the lateral edge 103 of the semiconductor body 100. When the component is in the off state, the potential $U_4$ present at the location 128 is also present essentially unchanged at a third electrode 93, which is applied to the front side 101 of the semiconductor body 100 and which is connected to the second semiconductor zone 12 via a seventh semiconductor zone 129 and an eighth semiconductor zone 31. The seventh semiconductor zone 129 and the eighth semiconductor zone 31 are arranged outside the active component region 100a and have the conduction type of the second semiconductor zone 12, wherein the eighth semiconductor zone 31 is doped more heavily than the seventh semiconductor zone 129. The third electrode 93 is furthermore connected to a ninth semiconductor zone 49 ("sinker"), which is doped complementarily to the second semiconductor zone 12 and which, for its part, is connected to the patterned fourth semiconductor zone 4 and electrically connects the latter to the third electrode 93. The ninth semiconductor zone 49 can be doped in such a way that it is not depleted at least in a portion situated between the third electrode 93 and the layer 18, even at those voltages at which the avalanche breakdown occurs at the pn junction formed between the second semiconductor zone 12 and the third semiconductor zone 13.

On account of the potential control structure, the patterned fourth semiconductor zone 4 is at the electrical potential $U_4$ when the diode is in the off state. The first field electrode 961 serves to electrically decouple the seventh semiconductor zone 129 from a front-side portion of the second semiconductor zone 12, the portion being located laterally alongside the first field electrode 961 and the dielectric 26 thereof. For this purpose, the first field electrode 961 is arranged between the seventh semiconductor zone 129 and the second semiconductor zone 12 and extends into the semiconductor body 100 in a direction of the first semiconductor zone 11 proceeding from the front side 101. The potential fed to the patterned fourth semiconductor zone 4 when the diode is in the off state can be set by using the depth t961 into which the first field electrode 961 including the dielectric 26 surrounding it extends into the semiconductor body 100 in the vertical direction v. The greater the depth t961 is chosen to be, the less the electrical potential of the patterned fourth semiconductor zone 4 differs from the electrical potential of the portions 125 of the drift zone 12.

Moreover, the potential control structure, in the same way as the potential control structures in the subsequent exemplary embodiments, includes an optional resistor 80, which electrically connects the patterned fourth semiconductor zone 4 to the first semiconductor zone 11, for example via the ninth semiconductor zone 49, the third electrode 93 and the second electrode 92. In this case, the resistor 80 can be integrated into the semiconductor body 100 or be arranged outside the semiconductor body 100. A resistor 80 formed within the semiconductor body 100 can be realized for example by one or a plurality of doped semiconductor zones, wherein pn junctions can optionally be formed between such doped semiconductor zones.

The potential control structure is dimensioned in such a way that at a predetermined reverse voltage dropped between the anode terminal A and the cathode terminal K, for example 100 V to 400 V, on account of the electrical potential $U_4$ fed to the patterned fourth semiconductor zone 4, all sections 125 of the drift zone 12 which penetrate through the layer 18 of the patterned fourth semiconductor zone 4 are completely covered by the space charge zones 29. This has the effect that the second semiconductor zone 12 is largely depleted of charge carriers in the layer 18 which extends as far as the lateral edge 103 of the semiconductor body 100 in each lateral direction r1, r2 perpendicular to the vertical direction v. The depleted portions of the second semiconductor zone 12 can take up a high reverse voltage. As a result of this "active" depletion of free charge carriers from those portions of the second semiconductor zone 12 which are situated in the layer 18, the second semiconductor zone 12, at least in the portions, can be doped more highly, for example with a dopant concentration of $10^{14}$ cm$^{-3}$ to $10^{18}$ cm$^{-3}$, than in the case of a diode which is constructed identically but which does not have a patterned fourth semiconductor zone 4. This increased doping by comparison with a conventional diode brings about a reduction of the on resistance.

Apart from its function of connecting the patterned fourth semiconductor zone 4 to a defined electrical potential in the off-state case, the potential control structure can also be designed to discharge the patterned semiconductor zone 4 upon the component being switched on, that is to say upon the transition from the off state illustrated to the on state.

The potential control structure explained above was chosen by way of example in order to explain the functioning of a component having a patterned fourth semiconductor zone 4. In principle, the potential control structure illustrated, in an identical or modified form, can also be applied to other semiconductor components having a drift zone, for example to MOSFETs or IGBTs. As an alternative to this, the potential control structure of a diode or of some other semiconductor component can be configured totally differently from the potential control structure explained, as long as the patterned fourth semiconductor zone 4, when the component is in the off state, has a potential which lies between the electrical potentials which the drift zone 12 has between the third semiconductor zone 13 and the patterned semiconductor zone 4.

Figure 2:
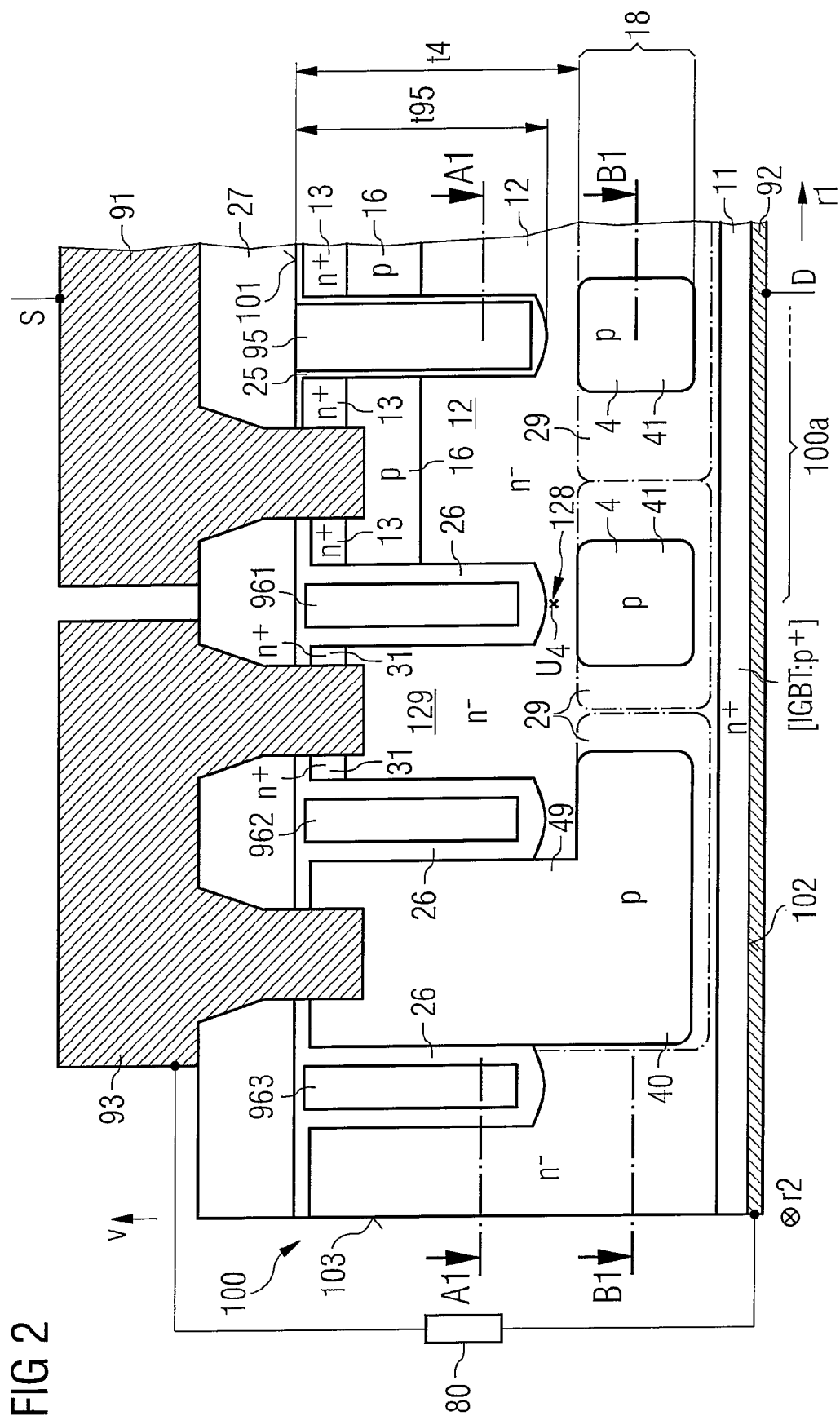
FIG. 2 illustrates a vertical section through an edge region of a vertical semiconductor component formed as a trench transistor, a patterned semiconductor zone being arranged in the drift zone of the component.
Figure 4:
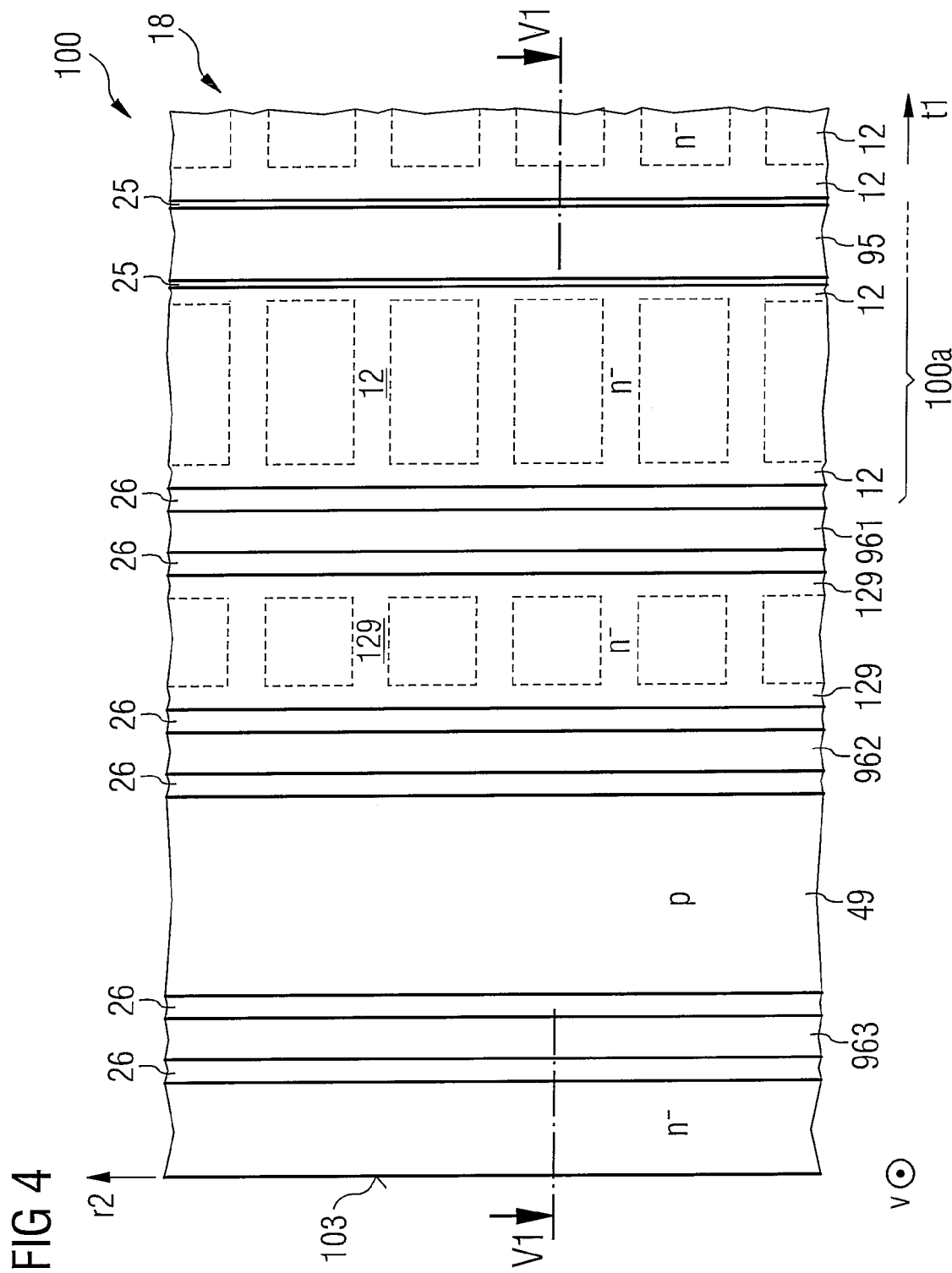
FIG. 4 illustrates a horizontal section through the edge section of a trench transistor illustrated in FIG. 2, in a sectional plane A1, perpendicular to the vertical direction, through the gate electrodes of the trench transistor.

FIG. 2 illustrates a vertical section through the edge region of a semiconductor component formed as a vertical trench transistor (trench MOSFET), in a sectional plane V1 which can be seen from FIGS. 3 and 4. As an alternative to the exemplary embodiment illustrated, the semiconductor component can also be formed as an IGBT. In the case of an IGBT, the heavy n-type doping of the first semiconductor zone 11 formed as a drain zone should be replaced by a heavy p-type doping.

In the case of this trench transistor, the function and the construction of the potential control structure and of the patterned fourth semiconductor zone 4 are identical to the function and the construction of the potential control structure and of the patterned fourth semiconductor zone 4 of the diode in accordance with FIG. 1.

In contrast to the diode in accordance with FIG. 1, the trench transistor in accordance with FIG. 2 has a cell structure formed in the active component region and having one or a plurality of parallel-connected active transistor cells arranged at a distance from one another in the first lateral direction r1. Owing to the cell structure, the transistor portion 100a having the active transistor cells is also referred to as "active cell region". In the first lateral direction r1, there are adjacent to the illustrated active transistor cell having the gate electrode 95 even further active transistor cells (not illustrated) having gate electrodes 95 of this type. The gate electrodes 95 are arranged in a trench having the depth t95—relative to the front side 101. In the case of a semiconductor component having such a trench structure, the distance t4 can be chosen for example to be less than 1 times to 2 times the depth t95 of the gate electrodes 95.

In each of the transistor cells, a p-doped sixth semiconductor zone 16 formed as a body zone and also a heavily n-doped third semiconductor zone 13 formed as a source zone are arranged between the second semiconductor zone 12 and the front side 101. In a departure from the diode in accordance with FIG. 1, the third semiconductor zone 13 is not p-doped but rather n-doped in the case of the present MOSFET. Furthermore, the first electrode 91 applied to the front side 101 represents a source electrode that is electrically connected to the third semiconductor zone 13. The second electrode 92 applied to the rear side 102 represents a drain electrode that is electrically connected to the first semiconductor zone 11. Moreover, a source terminal S connected to the source electrode 91 and a drain terminal D connected to the drain electrode 92 are provided for external circuitry connection of the transistor.

In order to control an electric current between the source terminal S and the drain terminal D, in one embodiment in order to switch the current on or off, the gate electrodes 95 are provided. The latter extend into the second semiconductor zone 12 in a direction of the first semiconductor zone 11, but are at a distance from the first semiconductor zone 11. A gate dielectric 25 is provided for electrically insulating the gate electrodes 95 from the second semiconductor zone 12, the sixth semiconductor zone 16 and the third semiconductor zone 13.

Alongside the first field electrode 961 already explained, which terminates the active component region 100a toward the lateral edge 103 of the semiconductor body 100, a second field electrode 962 and a third field electrode 963 are also provided, which extend into the semiconductor body 100 in a direction of the first semiconductor zone 11 proceeding from the front side 101 and are a distance from the first semiconductor zone 11. The second field electrode 962 is arranged between the ninth semiconductor zone 49 and the seventh semiconductor zone 129 and is electrically insulated from that of the second semiconductor zone 12 by using a dielectric 26. The third field electrode 963 is arranged between the lateral edge 103 of the semiconductor body 100 and the ninth semiconductor zone 49 and is electrically insulated from that of the ninth semiconductor zone 49 by using a dielectric 26.

If only precisely one patterned semiconductor zone such as the present patterned fourth semiconductor zone 4 is provided in the semiconductor component, for example all of the field electrodes 961, 962, 963 can be at source potential, that is to say the potential of the third semiconductor zone 13 and the first electrode 91. As an alternative to this, the field electrodes 961, 962, 963 of the component can for example also all be arranged in floating fashion in the semiconductor body 1.

Figure 7:
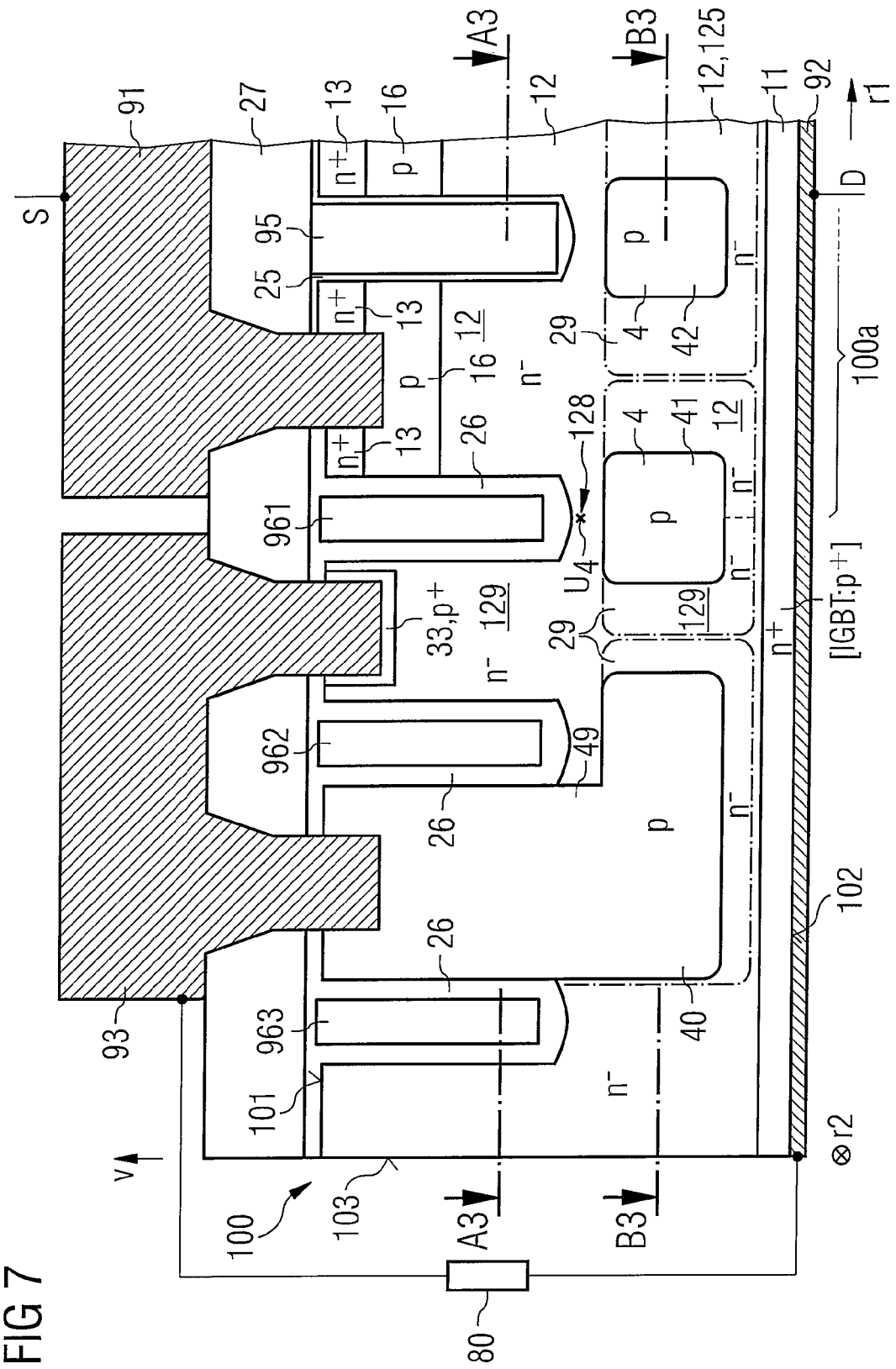
FIG. 7 illustrates a vertical section through the edge region of a trench transistor which has a basic construction in accordance with FIG. 2, but in which the potential control structure has a further semiconductor zone doped complementarily to the drift zone.
Figure 8:
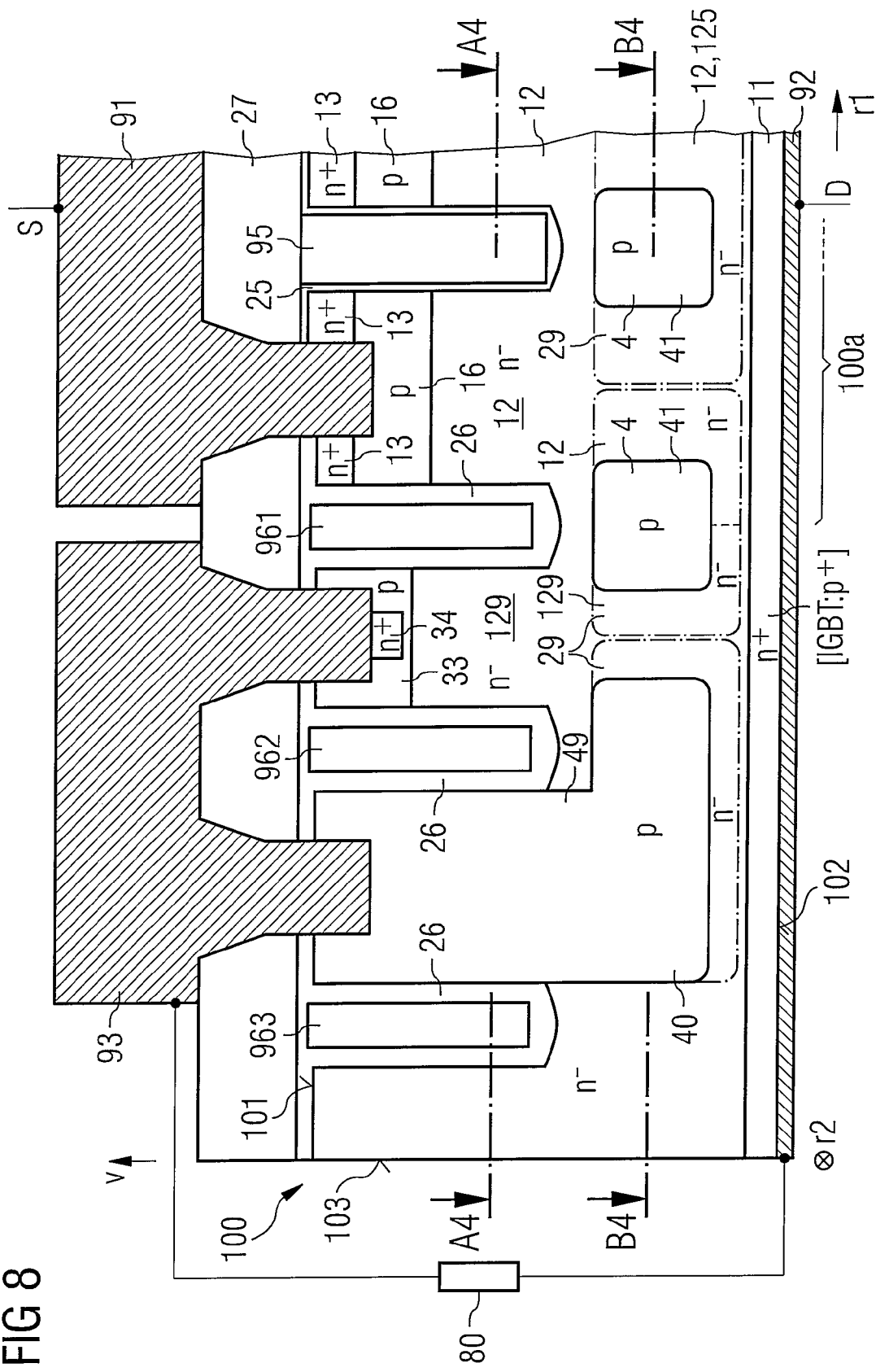
FIG. 8 illustrates a vertical section through the edge region of a trench transistor having a basic construction in accordance with FIG. 2, but in which the potential control structure has a zener diode integrated into the semiconductor body.
Figure 11:
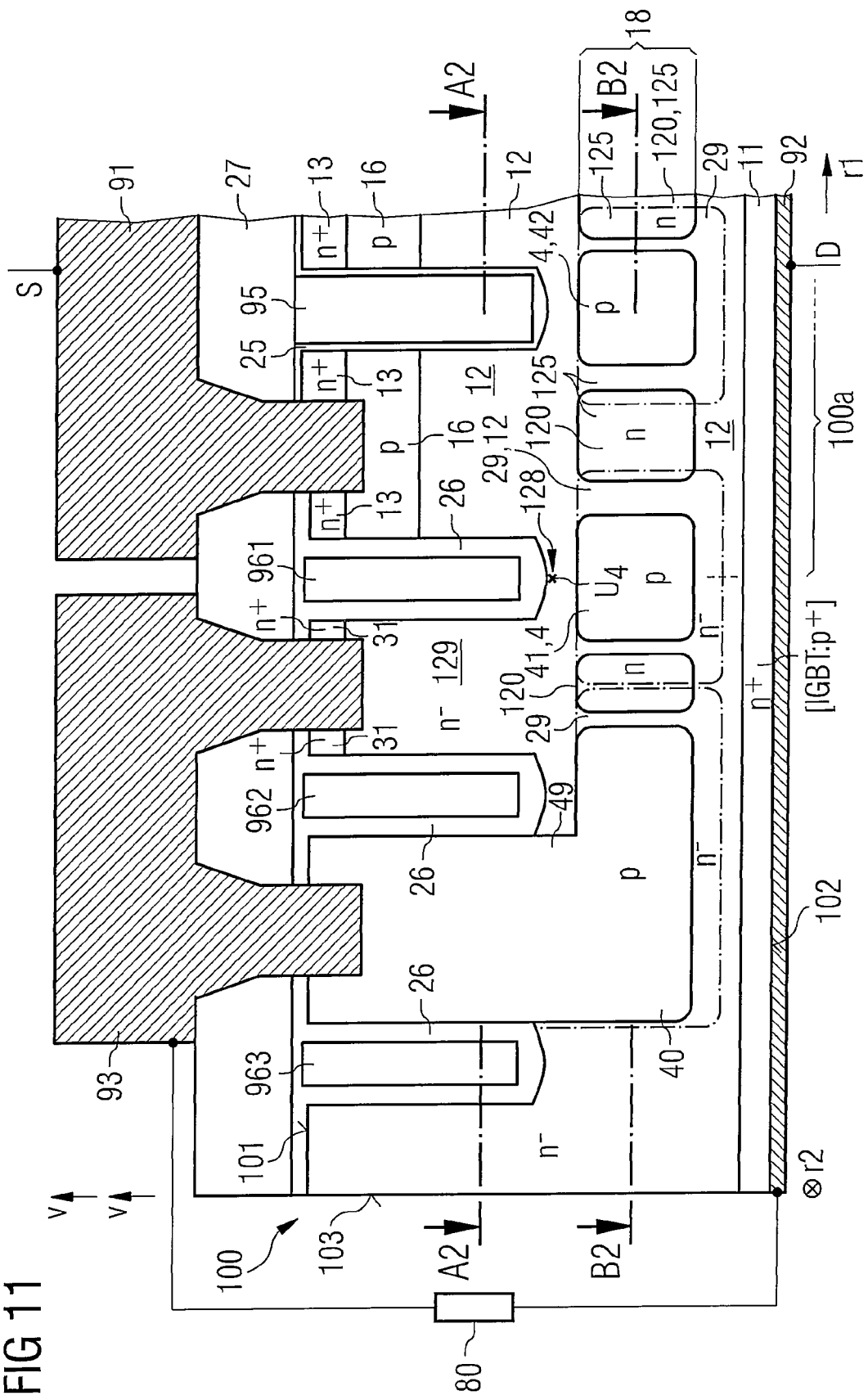
FIG. 11 illustrates a vertical section through an edge portion of a vertical trench transistor in accordance with FIG. 2, but in which a dopant of the first conduction type is additionally introduced into the drift zone between two adjacent portions of the patterned semiconductor zone, the dopant having only a very low diffusion rate.

FIG. 3 illustrates a horizontal section through a portion of the diode illustrated in FIG. 1 or of the trench transistor illustrated in FIG. 2, in a sectional plane B1 perpendicular to the vertical direction v. This horizontal section is moreover identical to the horizontal sections through sectional planes B2, B3 and B4 such as are illustrated in FIGS. 11, 7 and 8, respectively.

It can be seen from the sectional view in accordance with FIG. 3 that the ninth semiconductor zone 49 and also the portions 40, 41 and 42 of the patterned fourth semiconductor zone 4 can be formed in strip-like fashion and can run in a second lateral direction r2 perpendicular both to the vertical direction v and to the first lateral direction r1. Moreover, the patterned fourth semiconductor zone 4 can have a reticulated or lattice-like structure as in the present case. As an alternative thereto, other structures, e.g., strip-like, meander-like, comb-like or comb-like intermeshing, structures are also conceivable. What is crucial is that the patterned fourth semiconductor zone 4 pervades the second semiconductor zone 12 sufficiently densely.

In order to electrically connect the sinker 49 to the portions 40, 41 and 42 and also to further portions (not illustrated) of the patterned fourth semiconductor zone 4, connecting webs 48 are provided, which extend in the first lateral direction r1 and which connect the fourth semiconductor zone 49 to the first 40 of the strip-like portions 40, 41, 42, and adjacent strip-like portions 41, 42 to one another. As can be seen from FIG. 3, the patterned fourth semiconductor zone 4 can be formed as a continuous semiconductor zone through which the portions of the second semiconductor zone 12 extend in a pillar-like manner.

FIG. 4 illustrates the same transistor edge portion as FIGS. 2 and 3 in a sectional plane A1—which can likewise be seen from FIG. 2 with respect to the sectional plane B1—through the gate electrodes 95 and through the field electrodes 961, 962, 963. The underlying sectional view known from FIG. 3 is additionally illustrated by dashed lines. This horizontal section is moreover identical to horizontal sections through sectional planes A3 and A4 such as are illustrated in FIGS. 7 and 8, respectively.

In the case of the transistor in accordance with FIG. 4, the first, the second and the third field electrode 961, 962 and 963, respectively, and also the active cells of the transistor with their gate electrodes 95 are formed as strips running in the second lateral direction r2. Comparison of FIGS. 3 and 4 reveals that the portions 40, 41, 42 of the patterned fourth semiconductor zone 4 and the active cells with the gate electrodes 95 run in the same lateral direction r2. In this case, the pitch of the active transistor cells can be chosen to be less than, equal to or greater than the pitch of the portions 41, 42 of the patterned fourth semiconductor zone 4.

In a departure from the exemplary embodiment in accordance with FIGS. 2, 3 and 4, strips of active transistor cells formed in strip-like fashion and portions 40, 41, 42 of the patterned fourth semiconductor zone 4 which are formed in strip-like fashion can run in different lateral directions, for example in the lateral directions r1 and r2. In principle, however, the different lateral directions r1, r2 can also form an angle that is different from 90°.

In principle, the cell structure of the totality of the active transistor cells arranged in an active component portion 100a can be chosen independently of the cell structure of that portion of the patterned fourth semiconductor zone 4 which is arranged in the same active component portion 100a. Apart from strip-like structures, by way of example, strip-like, reticulated, lattice-like, meander-like, comb-like or comb-like intermeshing structures are also suitable here in each case as cell structures.

In order to further increase the reverse voltage strength of the transistor or to achieve an additional reduction of the on resistance, instead of only one patterned semiconductor zone, it is also possible to provide two or more patterned semiconductor zones which are doped complementarily to the second semiconductor zone 12 and are embedded into the second semiconductor zone 12 at a distance from one another in the vertical direction v. In the off state of the transistor, the different patterned semiconductor zones that are at a distance from one another have different electrical potentials lying in each case between the electrical potentials of the third semiconductor zone 13 and the first semiconductor zone 11.

Figure 5:
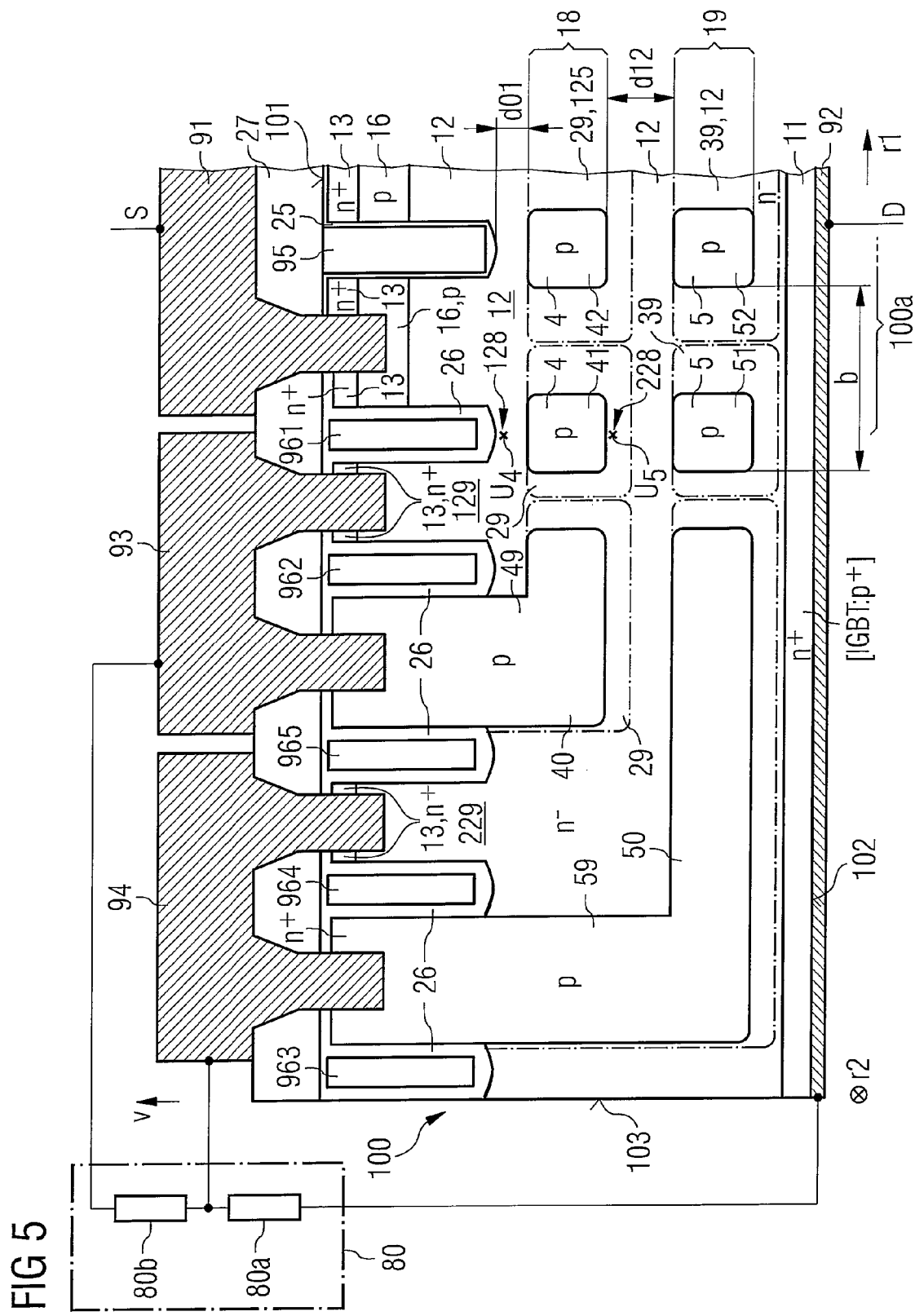
FIG. 5 illustrates a vertical section through an edge portion of a vertical trench transistor with two patterned semiconductor zones which are arranged in the drift zone and are at a distance from one another.

FIG. 5 illustrates an exemplary embodiment in respect thereof on the basis of a transistor having a p-doped patterned fourth semiconductor zone 4 and a likewise p-doped patterned fifth semiconductor zone 5.

In the same way as the patterned fourth semiconductor zone 4, the patterned fifth semiconductor zone 5 also has portions 51, 52 which are at a distance from one another in the first lateral direction r1. A portion 126 of the drift zone 12 is respectively arranged between in each case two adjacent portions from among the portions 51, 52. The portions 51, 52 of the patterned fifth semiconductor zone 5 can be formed in strip-like fashion, by way of example. Instead of a strip-like structure, the second patterned semiconductor zone 5 can also have some other structure, for example a reticulated structure, a lattice-like structure, a meander-like structure, a comb-like structure or a comb-like intermeshing structure. In this case, the patterned fourth semiconductor zone 4 and the patterned fifth semiconductor zone 5 can have different or identical types of structure. In the case of identical types of structures, the latter can be oriented in the same sense or be rotated relative to one another, for example with respect to an axis running in the vertical direction v.

The patterned fifth semiconductor zone 5 is at a greater distance from the front side 101 of the semiconductor body 100 than the patterned fourth semiconductor zone 4. As already explained on the basis of the exemplary embodiment in accordance with FIGS. 2 to 4, the patterned fourth semiconductor zone 4 is at an electrical potential which, when the transistor is in the off state, essentially corresponds to the electrical potential $U_4$ which the second semiconductor zone 12 has at a location 128 located below a dielectric 26 of a first field electrode 961, which is arranged in a trench and which delimits the active component portion 100a toward the lateral edge 103 of the semiconductor body 100. Moreover, the patterned fourth semiconductor zone 4 is connected to the first semiconductor zone 11 via the third electrode 93 and also via two series-connected resistors 80a and 80b and via the second electrode 92. The overall resistor including the series circuit of the resistors 80a and 80b corresponds—with regard to its interconnection with the third electrode 93 and the first semiconductor zone 11—to the resistor 80 in accordance with FIG. 2.

Analogously to the patterned fourth semiconductor zone 4, the patterned fifth semiconductor zone 5, when the transistor is in the off state, is at an electrical potential essentially corresponding to the potential $U_5$ which the second semiconductor zone 12 has at a location 228 situated at the lateral edge of the active component portion 100*a*.

Thus, each of the two patterned semiconductor zones 4, 5, when the transistor is in the off state, is at an electrical potential lying between the electrical potential of the third semiconductor zone 13 and the potential of the second semiconductor zone 12 on that side of the respective patterned fourth or fifth semiconductor zone 4 or 5 which faces the front side 101.

The electrical potential $U_5$ is transferred to a fourth electrode 94 via a tenth semiconductor zone 229 of the conduction type of the second semiconductor zone 12 and via fifteenth connection zones 32, which are of the same conduction type as the tenth semiconductor zone 229 but doped more heavily than the latter. The patterned fifth semiconductor zone 5 is electrically connected to the fourth electrode 94, which is at a distance from the electrodes 91 and 93, via an eleventh semiconductor zone ("sinker") 59 doped complementarily to the second semiconductor zone 12. The patterned fourth semiconductor zone 4 and the patterned fifth semiconductor zone 5 are thus at different electrical potentials $U_4$ and $U_5$, respectively. The eleventh semiconductor zone 59 can be doped in such a way that it is not depleted at least in a portion situated between the fourth electrode 94 and the layer 19, even at those voltages at which the avalanche breakdown occurs at the pn junction formed between the second semiconductor zone 12 and the third semiconductor zone 13.

The patterned fourth semiconductor zone 4 is arranged in a layer 19 extending over the entire semiconductor body 100 in each direction perpendicular to the vertical direction v. In accordance with the space charge zone 29 in the layer 18, when the transistor is in the off state, a space charge zone 39 also forms in the layer 19, the charge carriers of the second semiconductor zone 12 being essentially depleted in the space charge zone, whereby the blocking capability of the transistor can be increased and the on resistance can be reduced.

In the case of the present exemplary embodiment, the location 228 to which the second patterned semiconductor zone 5 is connected lies at the lateral edge of the active component region 100*a* and directly below the patterned fourth semiconductor zone 4. In an analogous manner it is possible to add to the transistor even further patterned, p-doped semiconductor zones which are arranged between the patterned fifth semiconductor zone 5 and the first semiconductor zone 11 and which, when the transistor is in the off state, are in each case connected to an electrical potential which the second semiconductor zone 12 has at a location situated at the lateral edge of the active component region 100*a* directly below the patterned semiconductor zone closest to the further patterned semiconductor zone in a direction of the front side 101.

The use of two or more of such patterned semiconductor zones 4, 5 which are arranged successively in the vertical direction v and are doped complementarily to the second semiconductor zone 12 enables the reverse voltage strength of the transistor to be improved as required. If two or more of such patterned semiconductor zones 4, 5 are provided, the vertical distance d12 between adjacent patterned semiconductor zones 4, 5 can be chosen for example to be identically equal to the vertical distance d01 between the trench bottoms of the gate electrodes 95 and the patterned fourth semiconductor zone 4 nearest the gate electrodes 95. Likewise, the distances d01 and d12 can be chosen for example such that they have a ratio d01÷d12 of 0 (i.e. d01=0) to 1.

In the portions of the second semiconductor zone 12 which are arranged between the portions of the patterned fourth semiconductor zone 4 or between the portions of the patterned fifth semiconductor zones 5, the net dopant concentration can amount for example to 1.5 times to 100 times or 3 times to 30 times the net dopant concentration which the second semiconductor zone 12 has in the portions which, in the vertical direction v, downwardly and/or upwardly adjoin the respective patterned fourth semiconductor zone 4 or fifth semiconductor zone 5.

If the product of the net dopant concentration in the patterned semiconductor zone and the structure width thereof in the lateral direction considered, here r1 for example, and the product of the net dopant concentration in those portions of the second semiconductor zone 12 which are arranged between the portions of the patterned fourth semiconductor zone 4 and the structure width of the portions of the second semiconductor zone 12 in the same lateral direction with respect to one another have a ratio of 0.9 to 1.1, those portions of the second semiconductor zone 12 which are arranged between the portions 40, 41, 42 of the patterned fourth semiconductor zone 4 can be depleted. Otherwise, the component must be operated in the J-FET operating mode. The same relationship correspondingly holds true for one or a plurality of further patterned semiconductor zones such as e.g., the patterned semiconductor zone 5. In this case, the structure width is understood to be the distance between mutually corresponding locations of adjacent portions, here the portions 41, 42, of the relevant patterned semiconductor zone, here the fourth semiconductor zone 4. FIG. 5 illustrates by way of example a structure width b given by the distance b measured in the lateral direction r1 between those sides of the adjacent portions 41, 42 of the patterned fourth semiconductor zone 4 which face the ninth semiconductor zone 49.

In the case of the exemplary embodiment in accordance with FIG. 5, the patterned fourth semiconductor zone 4 and the patterned fifth semiconductor zone 5 have identical structure widths b in the same lateral direction r1. In a departure from this, the structure widths b of different patterned semiconductor zones 4 and 5 can differ from one another.

Analogously to the structure widths b of patterned semiconductor zones, structure widths of the transistor cells arranged in the active component region 100*a* can also be determined in each case in the lateral directions r1, r2. In this case, in the same lateral direction, the structure width of the transistor cells can be, as required, equal to, less than or greater than the structure width of one or a plurality of the patterned semiconductor zones 4, 5 of the component.

As can further be seen from FIG. 5, provision may be made for providing a potential decoupling structure between two adjacent sinkers 49, 59 which are a distance from one another in the first lateral direction r1, which potential decoupling structure at least partly shields the sinker 59, that is to say the eleventh semiconductor zone 59, from the electric field issuing from the sinker 49, that is to say the ninth semiconductor zone 49. Such a potential decoupling structure can have for example a second and/or a third or more field electrodes 962 and 963, respectively, arranged in a trench, which are electrically insulated by using dielectric 26 from the ninth semiconductor zone 49, from the eleventh semiconductor zone 59 and from the tenth semiconductor zone 229 arranged between the ninth semiconductor zone 49 and the eleventh semiconductor zone 59. In the case of a semiconductor component having at least two patterned semiconductor zones 4, 5 which are at a distance from one another in the vertical direction v and which have different electrical potentials in the case of a reverse voltage present at the semiconductor component, that one of the electrodes 96 which is closest to the lateral edge 103 in a predetermined lateral direction r1 can be connected to an electrical potential lying between the electrical potentials of the source electrode 91 and the drain electrode 92. As an alternative to this, the field electrodes 961, 962, 963 of the component can for example also all be arranged in floating fashion in the semiconductor body 1.

Furthermore, it is possible to arrange the third field electrode 963 for forming an edge structure between the lateral edge 103 of the semiconductor body 100 and the sinker 59 closest to the lateral edge 103. Furthermore, in the semiconductor body 100 it is possible to provide a fourth field electrode 964, which is arranged between the tenth semiconductor zone 229 and the eleventh semiconductor zone 59, extends into the semiconductor body 100 in a direction of the first semiconductor zone 11 proceeding from the front side 101 and electrically decouples the tenth semiconductor zone 229 from the eleventh semiconductor zone 59. Correspondingly, it is possible to provide in the semiconductor body 100 a fifth field electrode 965, which is arranged between the tenth semiconductor zone 229 and the ninth semiconductor zone 49, extends into the semiconductor body 100 in a direction of the first semiconductor zone 11 proceeding from the front side 101, and electrically decouples the ninth semiconductor zone 49 from the front-side portion of the tenth semiconductor zone 229.

In order to prevent the connection resistance of a patterned semiconductor zone 4, 5 from becoming too high, as an alternative or in addition to a sinker 49, 59 arranged between the lateral edge 103 of the semiconductor body 100 and an active component portion 100a closest to the lateral edge 103, it is possible to provide one or a plurality of further sinkers which are arranged between adjacent active component portions and are connected to the relevant sinker 49, 59.

Figure 6:
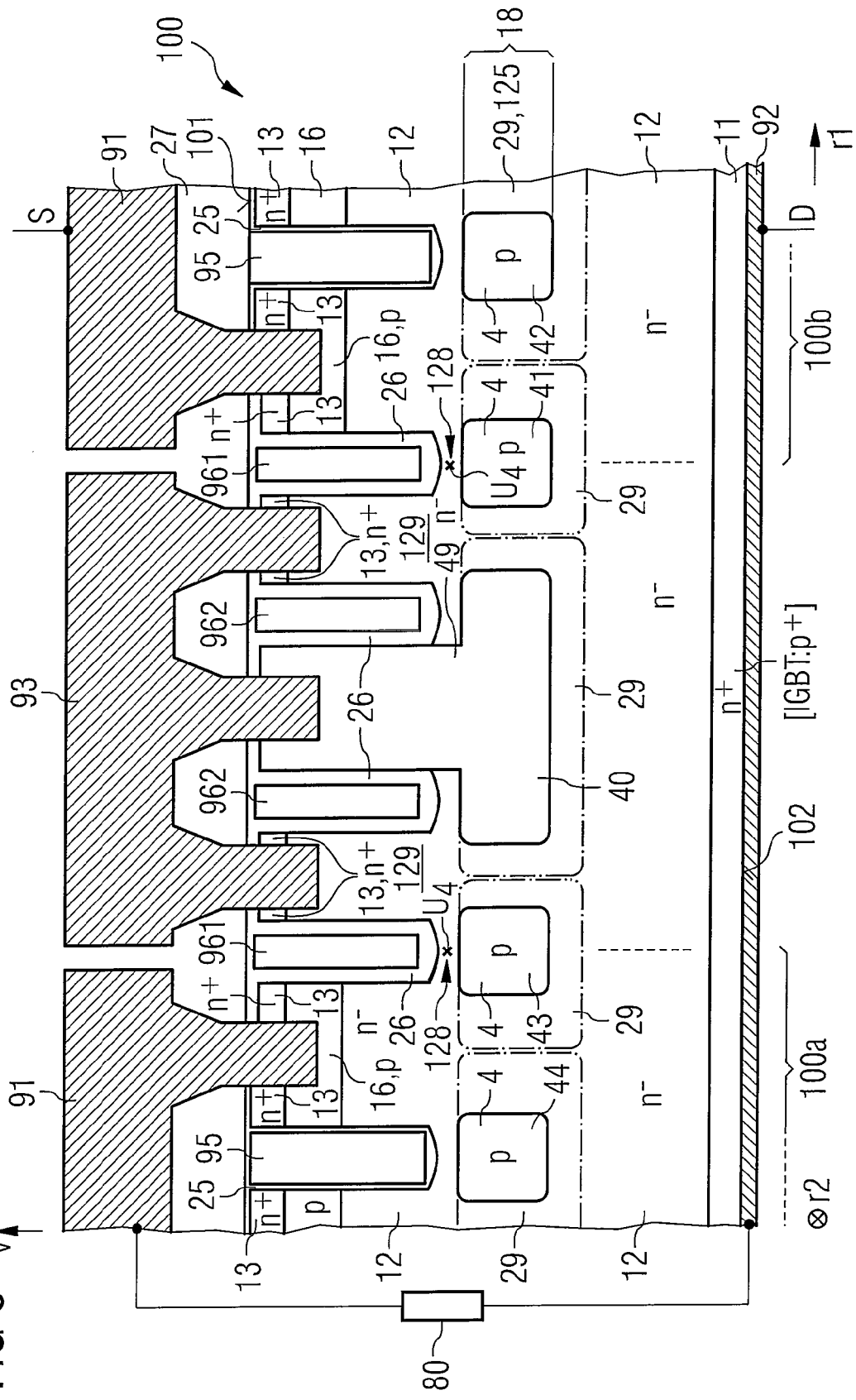
FIG. 6 illustrates a vertical section through the edge region of a trench transistor in accordance with FIG. 2 in which the patterned semiconductor zone is connected by using an additional sinker arranged between two adjacent active component portions.

As an exemplary embodiment in this respect FIG. 6 illustrates a portion of a transistor having only one patterned fourth semiconductor zone 4. This transistor portion can be for example a portion of the transistor in accordance with FIG. 2. The transistor in accordance with FIG. 6 includes two adjacent active component portions 100a, 100b which are at a distance from one another in the first lateral direction r1. The ninth semiconductor zone 49 is arranged between the active component portions 100a, 100b and connected to the patterned fourth semiconductor zone 4. The ninth semiconductor zone 49 is provided in addition to the ninth semiconductor zone 49 on the edge side that is illustrated in FIG. 2. In the same way as the ninth semiconductor zone 49 in accordance with FIG. 2 is connected to a third electrode 93 applied to the semiconductor body 100, the ninth semiconductor zone 49 in the case of the arrangement in accordance with FIG. 6 is connected to a further third electrode 93, wherein these third electrodes 93 can be electrically conductively connected to one another or electrically decoupled from one another. The third electrode 93 in accordance with FIG. 6 is connected to another seventh semiconductor zone 129 like the third electrode 93 in accordance with FIG. 2.

FIGS. 7 and 8 illustrate further exemplary embodiments of the vertical trench transistor explained with reference to FIGS. 2 to 4. In contrast to the transistor in accordance with FIG. 2, the transistors in accordance with FIGS. 7 and 8 have pn junctions having a low breakdown or punch voltage, which prevent, when the transistor is in the off state, charge carriers from being injected into that portion of the second semiconductor zone 12 which is closest to the seventh semiconductor zone 129.

Thus, the transistor in accordance with FIG. 7 is provided with a thirteenth semiconductor zone 33, which is doped complementarily to the seventh semiconductor zone 129, is arranged between the third electrode 93 and the seventh semiconductor zone 129 and is connected to the third electrode 93, and together with the seventh semiconductor zone 129 forms a pn junction.

In the case of the transistor in accordance with FIG. 8, a fourteenth semiconductor zone 34 is also arranged between the thirteenth semiconductor zone 33 and the third electrode 93, wherein the fourteenth semiconductor zone 34 has the conduction type of the seventh semiconductor zone 129 and can be doped more heavily than the latter. The fourteenth semiconductor zone 34 is connected to the third electrode 93 and together with the thirteenth semiconductor zone 33 forms a pn junction. The thirteenth semiconductor zone 33 in turn forms a pn junction with the seventh semiconductor zone 129 and is likewise connected to the third electrode 93. Moreover, the fourteenth semiconductor zone 34 is at a distance from the seventh semiconductor zone 129.

Figure 9:
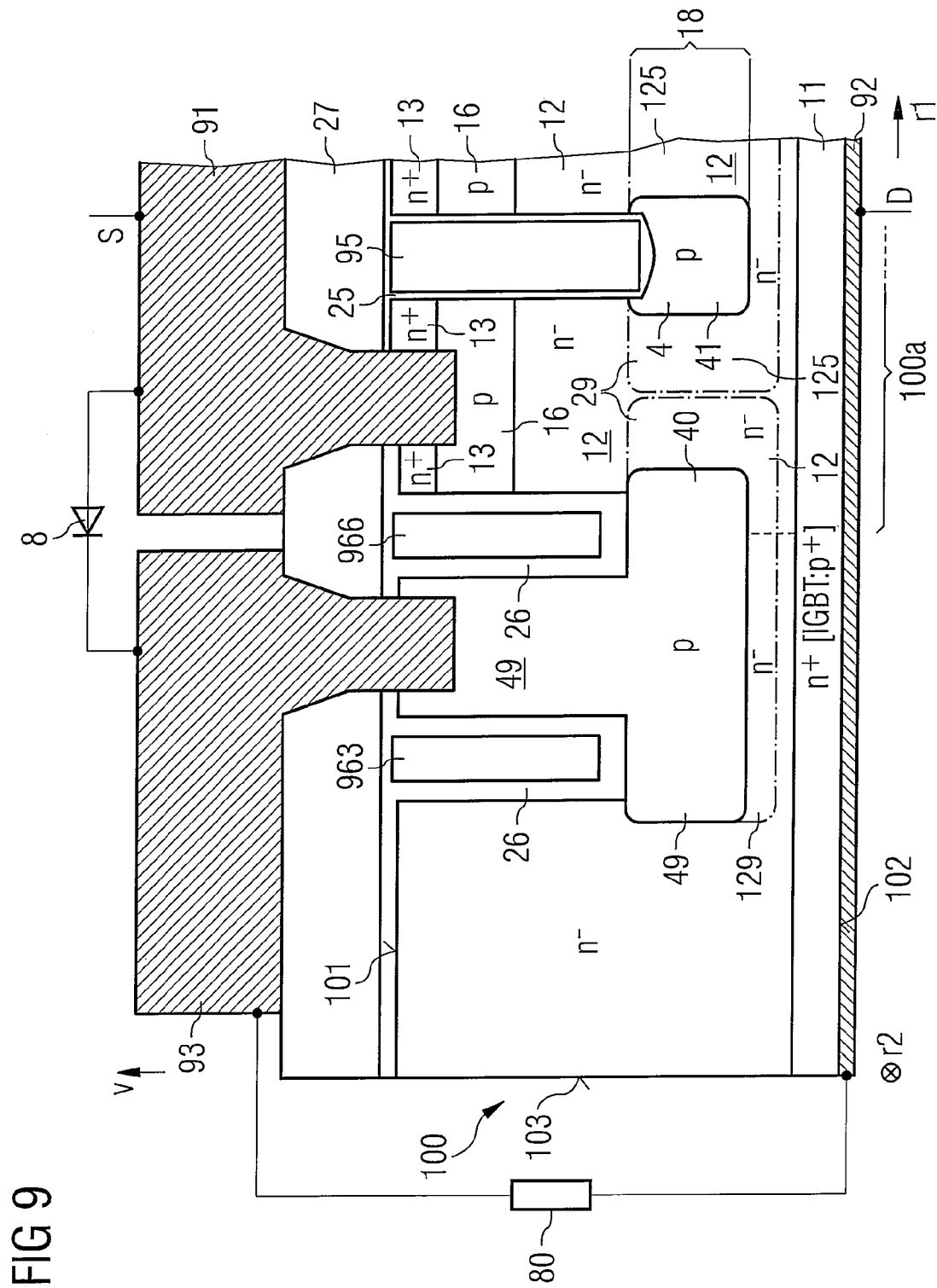
FIG. 9 illustrates a vertical section through an edge portion of a trench transistor in which the patterned semiconductor zone is connected to the source zone of the trench transistor by using an external diode.

As a further exemplary embodiment FIG. 9 illustrates a trench transistor in which the potential control structure includes a first diode 81, the anode of which is electrically connected to the source electrode 91 and the cathode of which is electrically connected to the patterned fourth semiconductor zone 4 via the ninth semiconductor zone 49. When the transistor is in the off state, the electrical potential of the patterned fourth semiconductor zone 4 is essentially determined by the voltage drop across the first diode 81. While the potential $U_4$ in the case of the exemplary embodiment in accordance with FIG. 1, when the component is in the off state, changes depending on the voltage difference present between the anode terminal A and the cathode terminal K, the potential $U_4$ in the case of the exemplary embodiment in accordance with FIG. 9 can be independent of the voltage difference between the source terminal and the drain terminal, for example if the first diode 81 is a zener diode having a predetermined breakdown voltage and a reverse voltage present between the electrodes 91, 92 is higher than the breakdown voltage of the first diode 81. The first diode 81 can be integrated into the semiconductor body 100 or be arranged outside the semiconductor body 100. In order to produce a higher voltage drop, two or more further diodes can also be connected in series with the first diode 81.

Since the electrical potential fed to the patterned fourth semiconductor zone 4 is concomitantly determined by the first diode 81, a seventh semiconductor zone 129, such as is illustrated for example in the case of the arrangement in accordance with FIG. 2, can be dispensed with given suitable dimensioning. In order to electrically decouple the ninth semiconductor zone 49 from the front-side portion of the second semiconductor zone 12, a sixth field electrode 966 is provided, which is arranged between the ninth semiconductor zone 49 and the second semiconductor zone 12 and extends into the semiconductor body 100 in a direction of the first semiconductor zone 11 proceeding from the front side 101.

Figure 10:
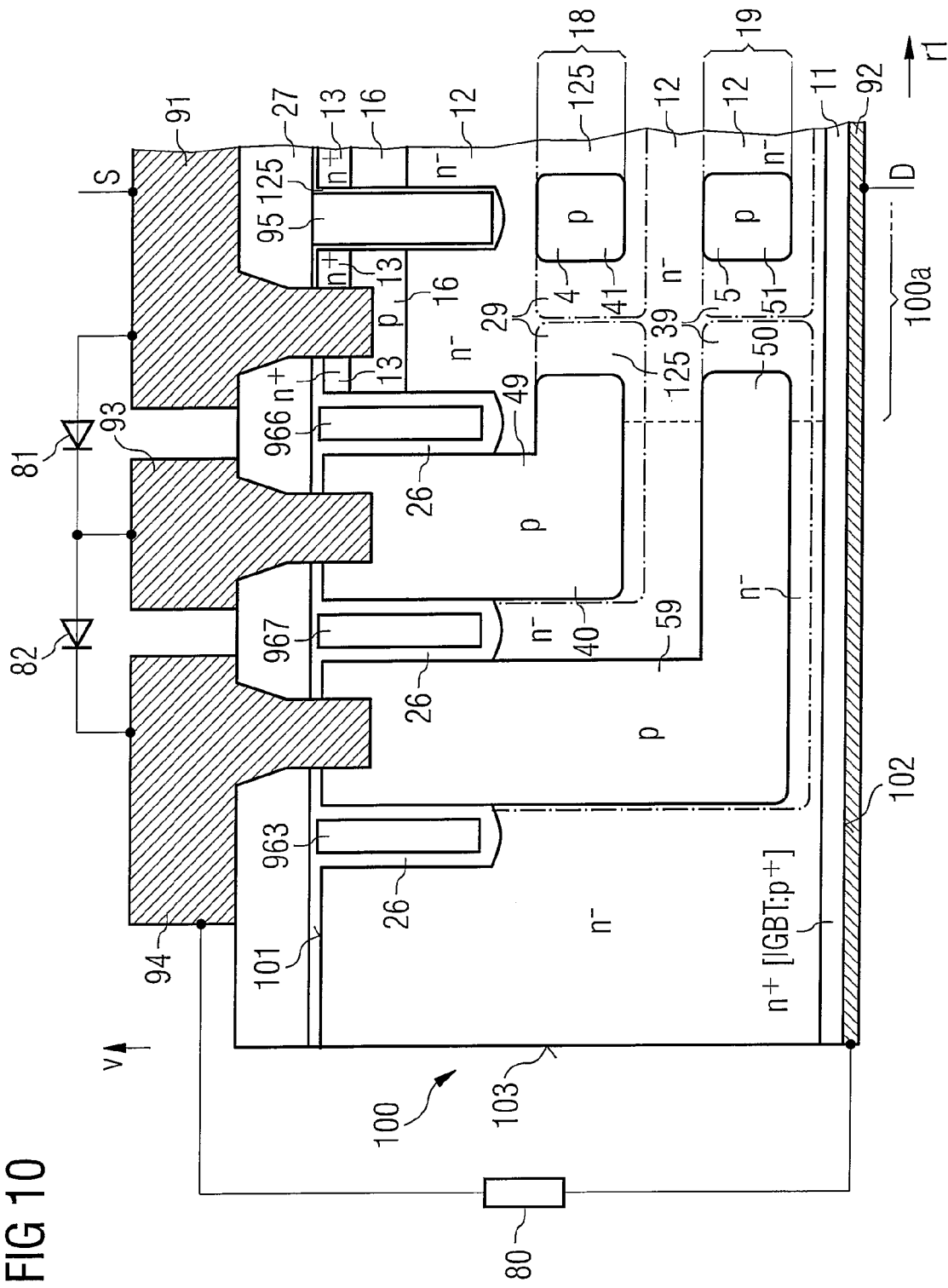
FIG. 10 illustrates a vertical section through an edge portion of a trench transistor which has two patterned semiconductor zones which are at a distance from one another in the vertical direction and which are respectively connected via a diode to the source zone.

It is likewise possible, as is illustrated in FIG. 10, analogously to the exemplary embodiment in accordance with FIG. 5, to provide two or more patterned fourth and fifth semiconductor zones 4, 5, respectively, the potential difference of which is set by using a respective second diode 82. The patterned fourth semiconductor zone 4 is connected to the third semiconductor zone 13 via the ninth semiconductor zone 49, via the third electrode 93, via the first diode 81 and via the source electrode 93, as was explained on the basis of the exemplary embodiment in accordance with FIG. 9. A patterned fifth semiconductor zone 5 is connected to the third electrode 93 via an eleventh semiconductor zone 59 formed as a sinker, via a fourth electrode 94 applied to the semiconductor body 100 on the front side, and via a second diode 82, wherein the anode of the second diode 82 is connected to the third electrode 93 and the cathode of the second diode 82 is connected to the fourth electrode 94. Consequently, the potential difference present between the patterned fourth semiconductor zone 4 and the patterned fifth semiconductor zone 5 when the transistor is in the off state is essentially determined by the voltage dropped across the second diode 82. Instead of being connected to the third electrode 93, the anode of the second diode 82 can also be connected to the first electrode 91. In order to electrically decouple the ninth semiconductor zone 49 and the eleventh semiconductor zone 59 from one another, it is possible to provide in the semiconductor body 100 a seventh field electrode 967, which is arranged between the ninth semiconductor zone 49 and the eleventh semiconductor zone 59 and extends into the semiconductor body 100 in a direction of the first semiconductor zone 11 proceeding from the front side 101.

In a corresponding manner, further patterned semiconductor zones of the conduction type of the patterned fourth or fifth semiconductor zone 4, 5 can be provided between the patterned fifth semiconductor zone 5 and the first semiconductor zone 11, wherein a further patterned semiconductor zone can be connected, by using a further diode, to another patterned semiconductor zone which is arranged between the source zone and the further patterned semiconductor zone. In this case, the diode can be connected to electrodes, one of which is electrically connected to the further patterned semiconductor zone via a sinker of the conduction type of the further semiconductor zone and the other of which is electrically connected to the other patterned semiconductor zone via another sinker of the conduction type of the other patterned semiconductor zone.

In an individual case it may be necessary, in a component arrangement, to choose relatively small distances for adjacent portions of a patterned semiconductor zone. This may have the consequence that dopants used for doping the patterned semiconductor zone, in the event of a temperature increase such as may occur during processing and/or during operation of the transistor, diffuse into a portion of the drift zone which is arranged between adjacent portions of the patterned semiconductor zone, whereby a significant lowering or even an inversion of the original doping can occur in the portion of the drift zone owing to the comparatively high dopant concentration in the patterned semiconductor zone. In order to avoid this, provision may be made for doping portions of the drift zone which are arranged between adjacent portions of the patterned semiconductor zone with a dopant which has only a low tendency toward thermal diffusion in comparison with conventional dopants.

This is illustrated in FIG. 11 on the basis of a vertical section through a transistor portion. The construction of this transistor portion corresponds, in principle, to the transistor portion in accordance with FIG. 2. The sectional view illustrated reproduces a section through the sectional plane V2 in accordance with FIG. 12.

The transistor in accordance with FIG. 11 has a patterned fourth semiconductor zone 4 having portions 40, 41, 42 which are at a distance from one another. A portion of a second semiconductor zone 12 is respectively arranged between adjacent portions 41, 42. Moreover, twelfth semiconductor zones 120 are arranged in the layer 18 between adjacent portions 40, 41, 42 of the patterned fourth semiconductor zone 4, the twelfth semiconductor zones being formed by portions 120 of the second semiconductor zone 12. The twelfth semiconductor zones 120 are doped with arsenic, which has an n-doping effect in silicon and has only a low tendency toward thermal diffusion.

As an alternative to this, the layer 18 (also the layer 19 in the case of the arrangement in accordance with FIG. 10) can also be produced as a p-doped epitaxial layer in which n-doped islands are produced by using a masked implantation of arsenic. The islands then correspond to the twelfth semiconductor zones 120 illustrated in FIG. 11 and, in a departure from the arrangement in accordance with FIG. 11, can also extend in the lateral direction r1 as far as the patterned fourth semiconductor zone 4 (or as far as the patterned semiconductor zone 4 and/or as far as the patterned semiconductor zone 5 in FIG. 10).

In the case of a transistor whose construction corresponds to the transistor in accordance with FIG. 2 but which is doped complementarily, that is to say in which p-doped semiconductor zones are provided instead of the n-doped semiconductor zones illustrated in FIG. 11 and in which n-doped semiconductor zones are provided instead of the p-doped semiconductor zones illustrated in FIG. 11, the patterned fourth semiconductor zone 4 itself can be doped with arsenic, such that regions which are arranged analogously to the regions 120 in accordance with FIG. 11 in the layer 18 of the patterned fourth semiconductor zone 4 but are p-doped can then be dispensed with.

As an alternative to this, the layer 18 in the case of a complementarily doped component, that is to say in which, inter alia, the second semiconductor zone 12 is p-doped and the patterned fourth semiconductor zone 4 and the patterned fifth semiconductor zone 5 are n-doped, can also be produced as a p-doped epitaxial layer in which the n-doped patterned fourth and fifth semiconductor zones 4 and 5, respectively, are produced by using a masked implantation of arsenic into the p-doped epitaxial layer. In the case of such a complementarily doped component, portions which correspond to the twelfth semiconductor zones 120 in accordance with FIG. 11 but are p-doped can be dispensed with.

FIG. 12 illustrates a horizontal section in a sectional plane B2 illustrated in FIG. 11, the sectional plane being perpendicular to the vertical direction v. It can be seen from this horizontal section, in conjunction with FIG. 11, that the second semiconductor zone 12 and the arsenic-doped portions 120 penetrate through the patterned fourth semiconductor zone 4 in pillar-like fashion. The arsenic-doped portions 120 can be at a distance from the patterned fourth semiconductor zone 4, as illustrated, but can also in a departure from the illustration in FIGS. 11 and 12 directly adjoin the patterned fourth semiconductor zone 4. The arsenic-doped twelfth semiconductor zones 120 stabilize the second semiconductor zone 12 in the layer 18 of the patterned fourth semiconductor zone 4. In a corresponding manner, such twelfth semiconductor zones 120 which stabilize the doping of the second semiconductor zone 12 can also be provided between portions of further patterned semiconductor zones, for example between portions 51, 52 of the patterned fifth semiconductor zone 5, as is known from the transistor in accordance with FIG. 5.

Various processes for producing a trench transistor in accordance with FIG. 5 are explained below with reference to FIGS. 13A to 13J. On the basis thereof, the person skilled in the art is also able, through suitable modifications of the method, to produce other components having a patterned semiconductor zone which, in the off state of the component, is connected to an electrical potential lying between potentials present at the component.

Figure 13A:
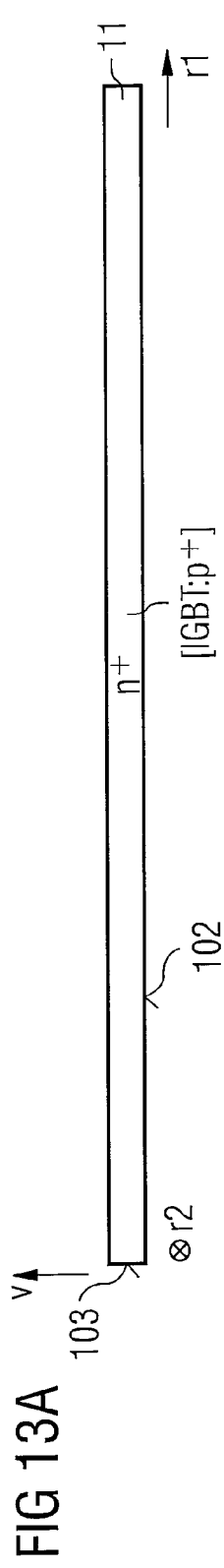
FIG. 13 illustrates various processes of a method for producing a trench transistor in accordance with FIG. 5.
Figure 13B:
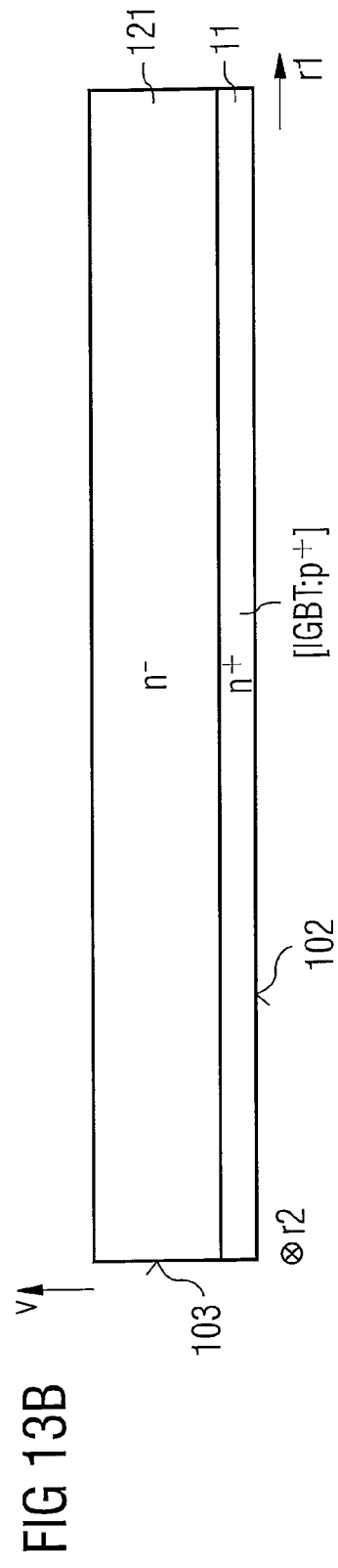

In accordance with FIG. 13A, the first process involves providing a heavily n-doped substrate 11 having a semiconductor basic material, for example silicon or silicon carbide, which later forms the first semiconductor zone 11 of the transistor. If the component to be produced is an IGBT, however, a heavily p-doped substrate 11 must be used instead of the heavily n-doped substrate 11. A weakly n-doped layer 121 is applied, for example epitaxially, to the substrate, the result of which is illustrated in FIG. 13B. As an alternative to the processes in accordance with FIGS. 13A and 13B, there is also the possibility of providing a weakly n-doped substrate and of producing the heavily n-doped semiconductor zone 11 on the rear side by diffusion and/or implantation of suitable dopants.

Figure 13C:
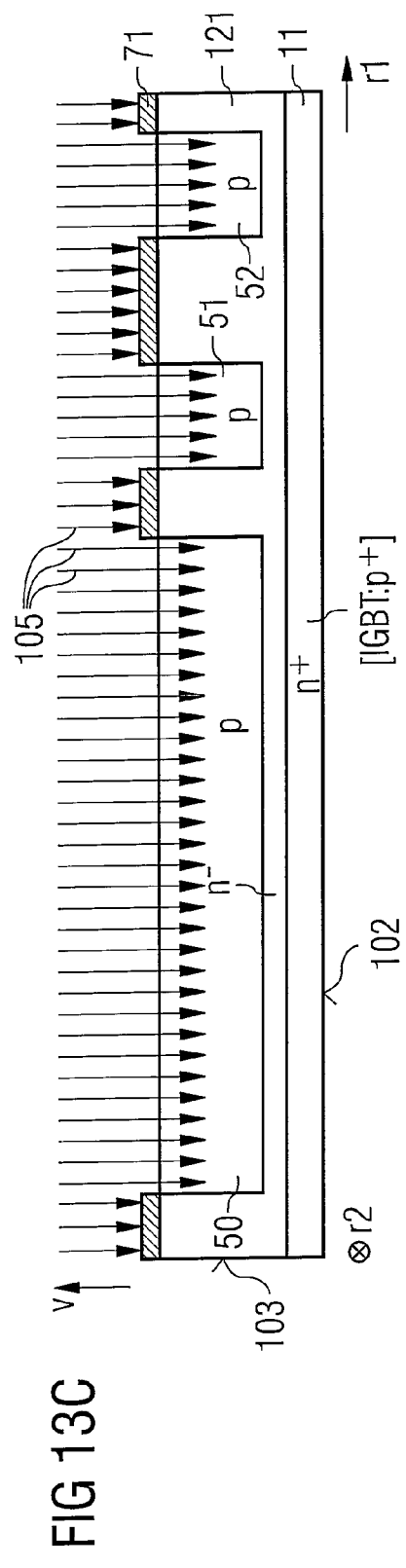

Mask 71 is applied to the arrangement in accordance with FIG. 13B and patterned. Using this patterned mask 71, a dopant 105 is implanted into the weakly n-doped layer 121, which dopant, in the semiconductor basic material used, brings about a doping complementarily to the doping of the second semiconductor zone 12 of the component to be produced. The implantation is carried out in such a way that the doping of the original layer 121 is inverted, thus giving rise to portions 50, 51 and 52 doped complementarily to the n-doped layer 121, which is illustrated in FIG. 13C. In principle, a diffusion could also be provided instead of an implantation, but this results in softer pn junctions between the layer 121 and the portions 50, 51, 52 produced therein. After the removal of the mask 71, a layer 122 of the conduction type of the second semiconductor zone 12 to be produced is applied, for example epitaxially, to this arrangement on the front side, the result of which is illustrated in FIG. 13D. Using a further patterned mask 72, which is applied to the arrangement in accordance with FIG. 13D on the front side, dopants 105 are again implanted, as illustrated in FIG. 13E, into the semiconductor body constructed up to that point, such that a p-doped semiconductor zone 591 arranged above the semiconductor zone 50 arises. The dopant 105 can have the same properties as the dopant 105 already described with reference to FIG. 13D.

Figure 13H:
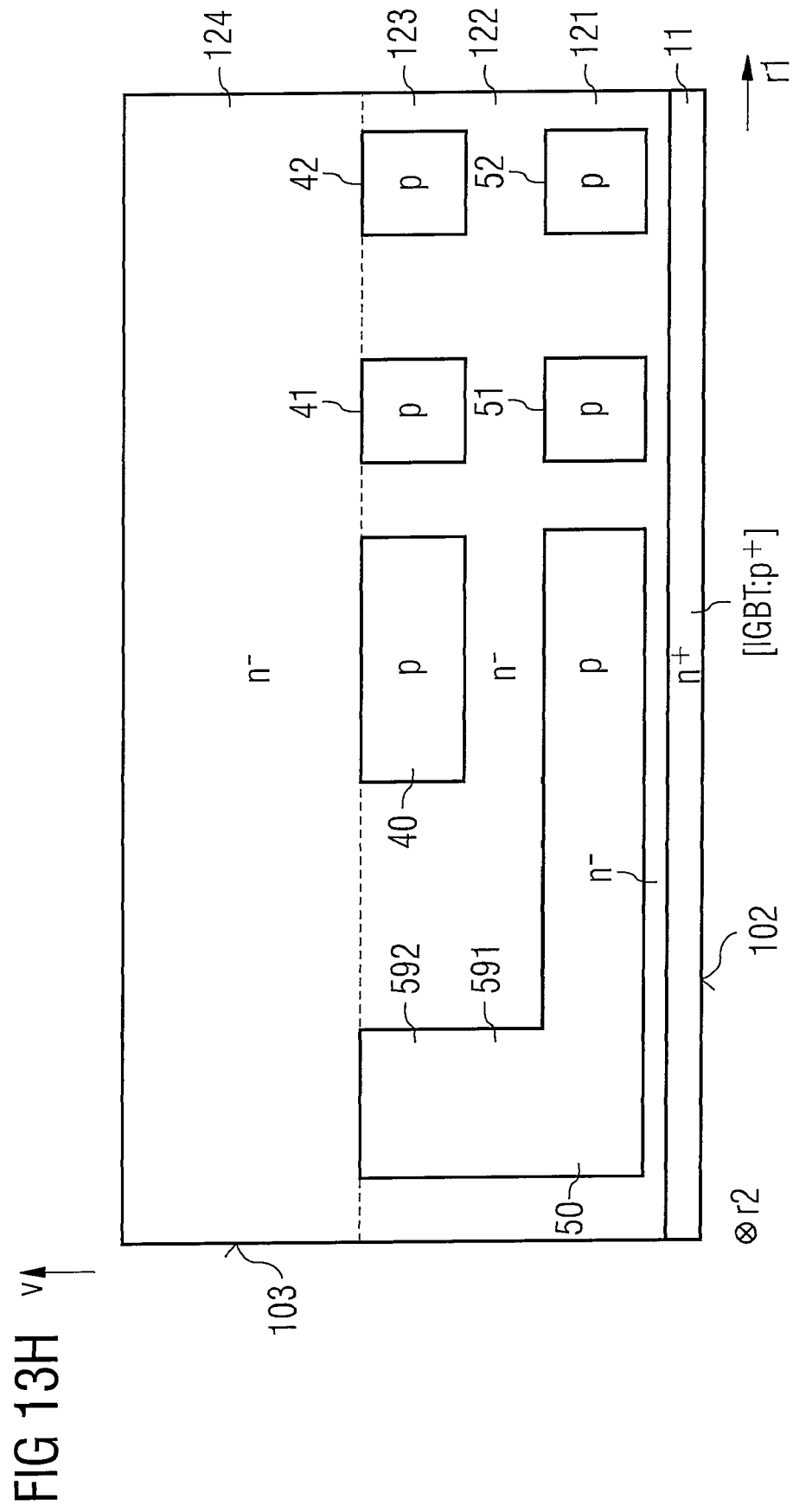

After the removal of the mask 72, a further layer 123 of the conduction type of the second semiconductor zone 12 to be produced is produced, for example epitaxially, on the front side, the result of which is illustrated in FIG. 13F. After using a further patterned mask 73 applied to the front side of this arrangement, dopants 105 are implanted in the semiconductor body constructed up to that point, thus giving rise to semiconductor zones 592, 40, 41, 42 doped complementarily to the doping of the second semiconductor zone 12 to be produced. In this case, the semiconductor zone 592 is produced above the semiconductor zone 591. The dopant 105 can have the same properties as the dopant 105 explained with reference to FIGS. 13C and 13E. FIG. 13G illustrates the arrangement during the implantation of the dopant 105. After the removal of the patterned mask 73, a layer 124 of the conduction type of the second semiconductor zone 12 to be produced is applied, for example epitaxially, on the front side to the semiconductor body constructed up to that point, the result of which is illustrated in FIG. 13H.

Figure 13I:
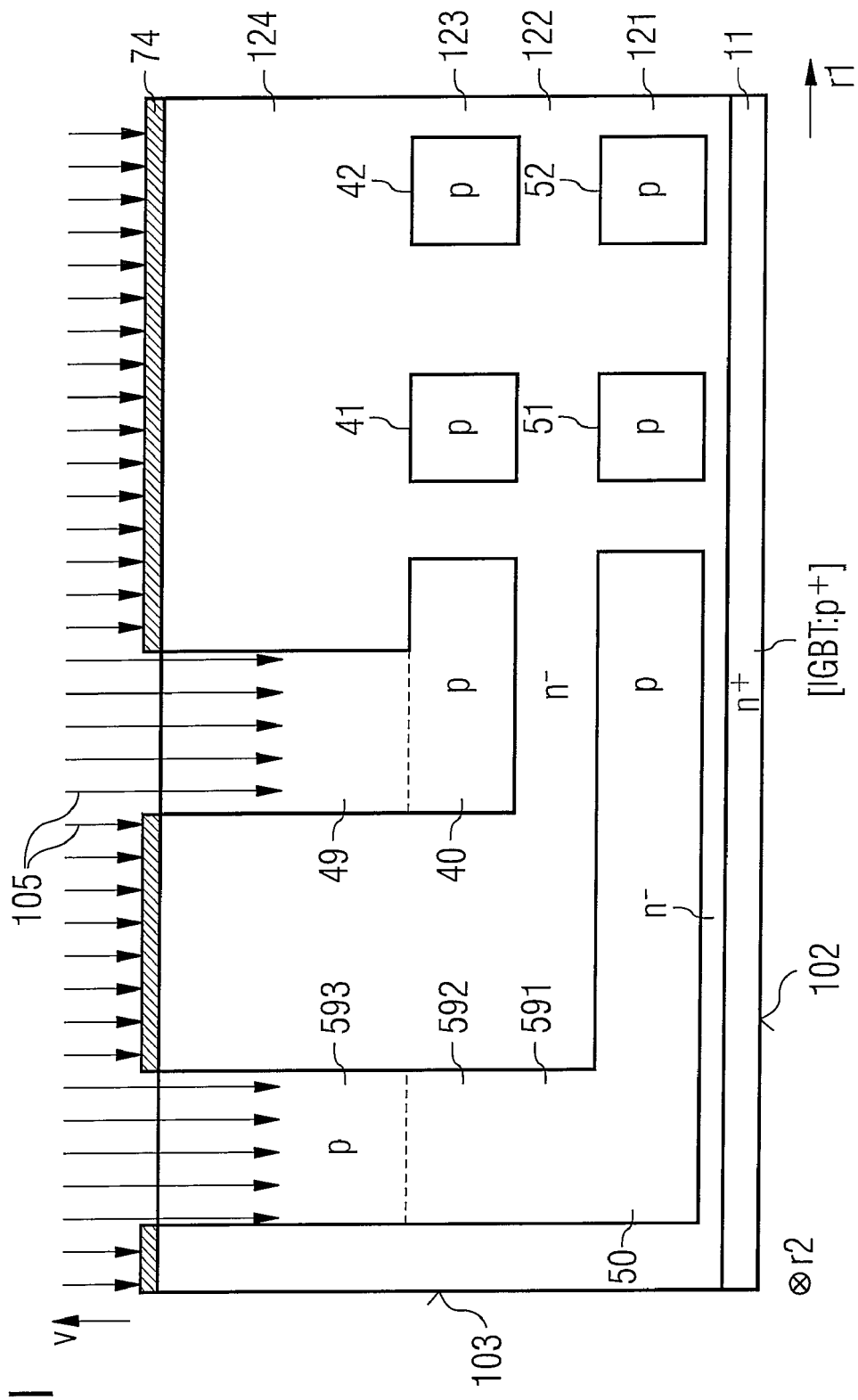

Afterward, using a patterned mask 74 applied on the front side, a dopant 105 is implanted into the semiconductor body constructed up to that point, in order to produce further p-doped semiconductor zones 593 and 49. In this case, the semiconductor zone 593 is produced above the semiconductor zone 592 and the semiconductor zone 49 is produced above the portion 40. The dopant 105 can have the same properties as the dopant 105 explained with reference to FIGS. 13C, 13E and 13G. FIG. 13I illustrates the arrangement during the implantation of the dopant 105. Removal of the patterned mask 74 yields the semiconductor body 100 illustrated in FIG. 13J with the patterned fourth semiconductor zone 4 including the portions 40, 41, 42, with the sinker 49 connected to the portion 40 of the patterned fourth semiconductor zone 4, with the patterned fifth semiconductor zone 5 including the portions 50, 51, 52, and with the sinker 59 connected to the portion 50 of the patterned fifth semiconductor zone 5.

In the case of the exemplary embodiment explained with reference to FIGS. 13A to 13J, semiconductor zones 50, 591, 592 and 593 which lie one above another, adjoin one another and form a continuous p-doped semiconductor zone were produced in order to form a sinker 59 connected to the patterned fifth semiconductor zone 5. Correspondingly, semiconductor zones 40 and 49 which lie one above another and adjoin one another were produced in order to form a sinker 49 connected to the patterned fourth semiconductor zone 4. In a departure from the exemplary embodiment explained, adjacent semiconductor zones 50, 591, 592, 593 and 40, 49 can initially also be produced at a distance from one another. By using a subsequent heat treatment process they can be subjected to outdiffusion and enlarged in the process, such that the adjacent semiconductor zones 50 with 591, 592 and 593, and 40 with 49 grow together and continuous p-doped semiconductor zones arise.

Figure 13J:
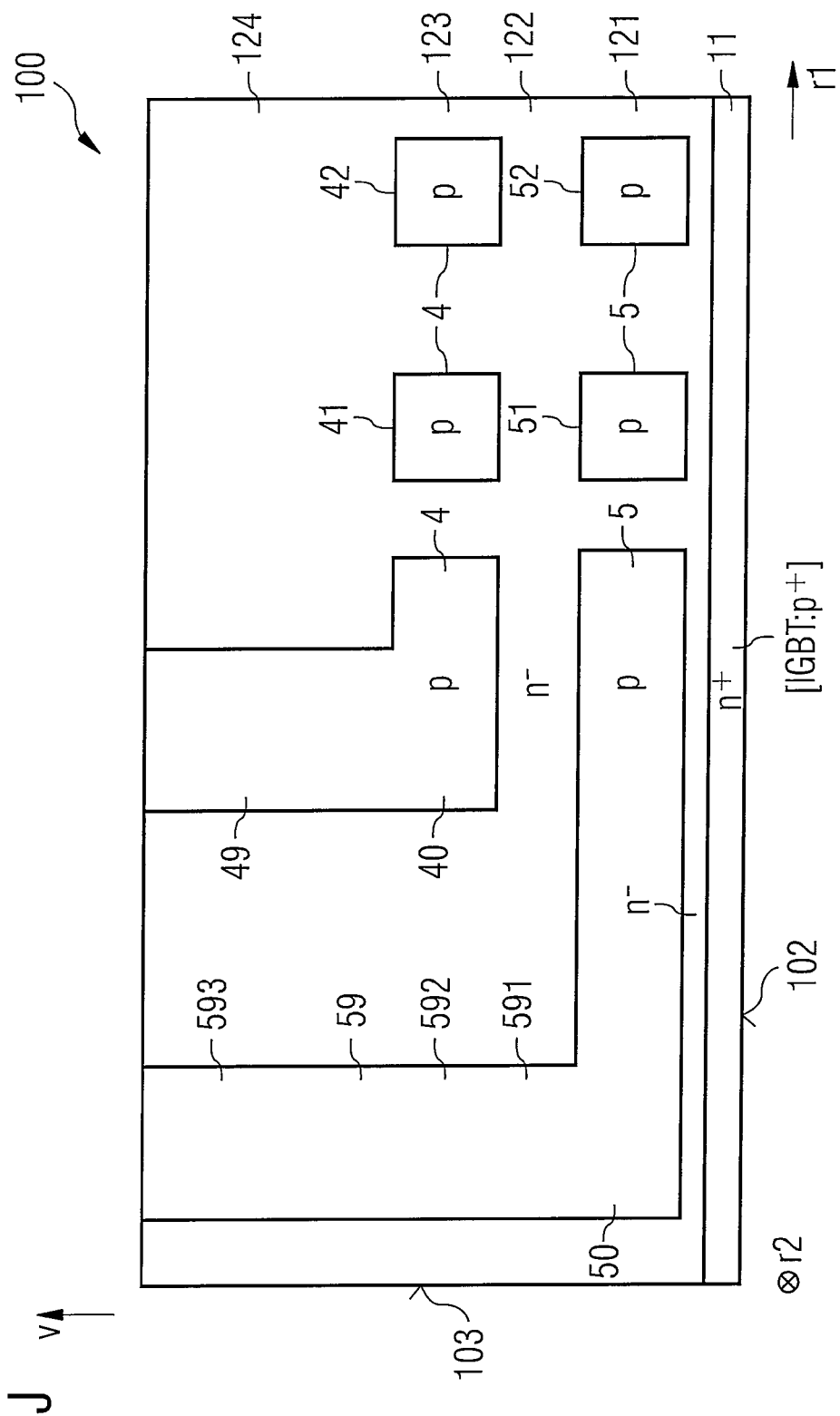

In the semiconductor body 100 illustrated in FIG. 13J, it is then possible, in a manner known per se, to produce the active region—illustrated in FIG. 5 with the third semiconductor zone 13, the sixth semiconductor zone 16, the gate dielectric zone 25, and also the gate electrodes 95, and to apply the electrodes 91 and 92. In this case, a larger thickness can be chosen for the dielectric 26 than for the gate dielectric 25. The production of the eighth semiconductor zone 31 and of the fifteenth semiconductor zone 32 can take place at the same time as the production of the third semiconductor zone 13, wherein a conventional patterned mask used for producing the third semiconductor zone 13 must be provided with openings at the corresponding locations above the semiconductor zones 31, 32 to be produced. The production of the third and/or fourth electrode 93 and/or 94, respectively, can take place in the same process as the production of the first electrode 91 and/or of the second electrode 92, wherein trenches reaching into the semiconductor material of the semiconductor body 100 as far as below the dielectric layer 27 must additionally be produced before the application of the electrode material. The electrodes 91, 92, 93, 94 can be formed for example as metallizations of the semiconductor body 100 and for example be composed of aluminum or have aluminum. As an alternative, the electrodes 91, 92, 93, 94 can for example also have or be composed of highly doped polycrystalline semiconductor material, e.g., highly doped polycrystalline silicon.

In the case of the exemplary embodiments explained above with reference to FIGS. 1 to 8, 11 and 12, first field electrodes 961 are provided which delimit the active component region 100a toward the lateral edge 103. The electrical potential present when the component is in the off state in the second semiconductor zone 12 directly below the first field electrodes 961 at the locations 128 is fed to the patterned fourth semiconductor zone 4 by using a seventh semiconductor zone 129, which is decoupled by the first field electrode 961 from the active component region 100a and thus from the third semiconductor zone 13 and also from the front-side portion of the second semiconductor zone 12 that is situated laterally alongside the first field electrode 961.

In principle, however, it is also possible to produce the electrical potential that is to be fed to a patterned fourth or fifth semiconductor zone when the component is in the off state without the use of such first field electrodes 961 and without the use of such seventh semiconductor zones 129, which is explained below on the basis of various examples with reference to FIGS. 14, 15 and 16.

Figure 14:
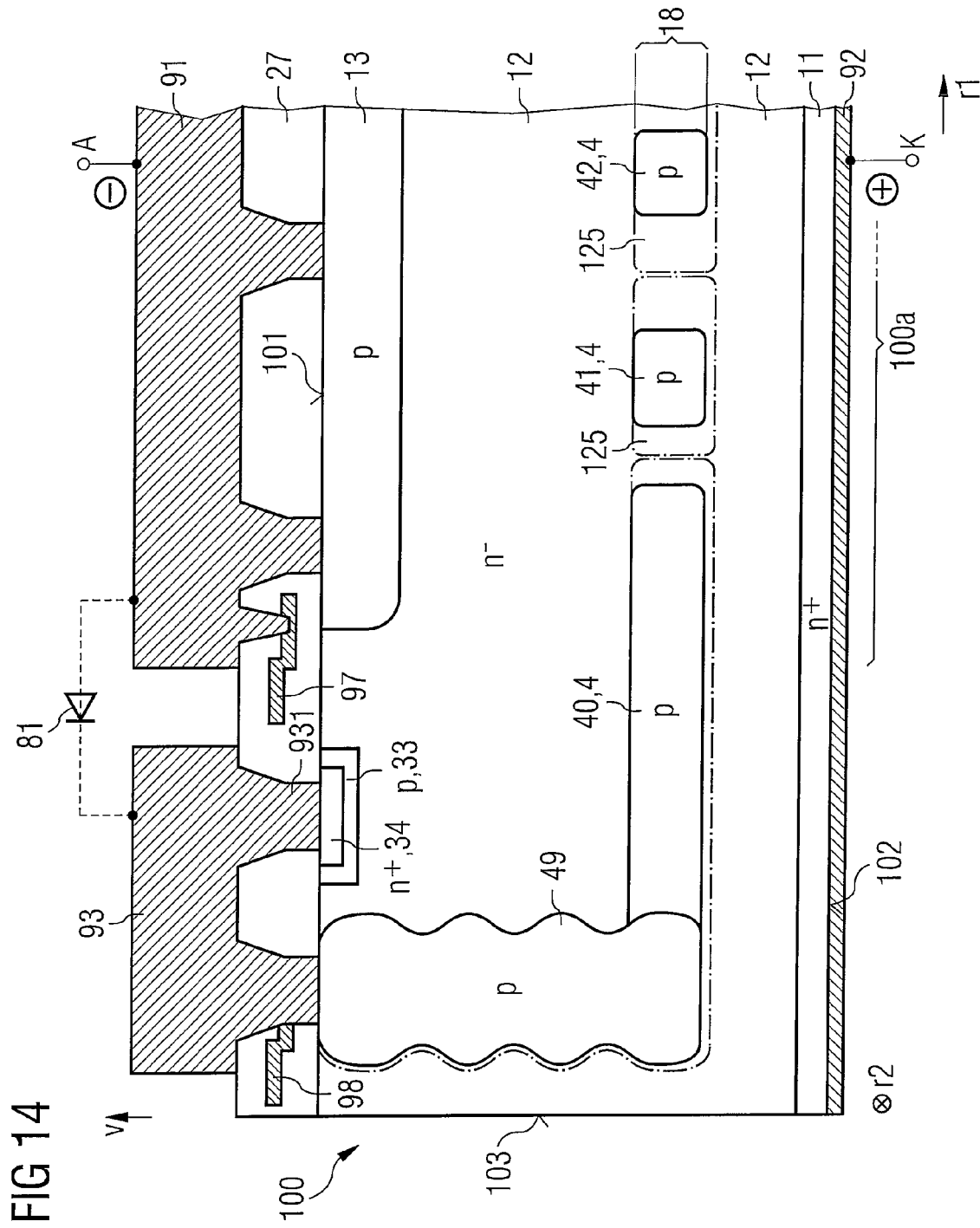
FIG. 14 illustrates a vertical section through a planar diode with an edge termination having a field plate structure, wherein the potential control structure includes a zener diode integrated into the semiconductor body of the planar diode.

FIG. 14 illustrates a vertical section through a planar diode. The planar diode includes a semiconductor body 100, in which a heavily doped first semiconductor zone 11 of the first conduction type, a weakly doped second semiconductor zone 12 of the first conduction type, and also a third semiconductor zone 13 of the second conduction type are arranged successively in a vertical direction v. The planar diode includes an active component region 100a, the lateral dimensions of which in all lateral directions r1, r2 perpendicular to the vertical direction v are defined by the lateral dimensions of the third semiconductor zone 13 forming the anode.

A first electrode 91 applied to the front side 101 is provided for making contact with the third semiconductor zone 13. A dielectric layer 27 is arranged between the front side 101 and the first electrode 91. Extensions of the first electrode 91 penetrate through the dielectric layer 27 and make contact with the semiconductor body 100 at the front side 101 in the region of the third semiconductor zone 13. A continuous second electrode 92 is applied to the rear side 102 for the purpose of making contact with the first semiconductor zone 11.

In the vertical direction v, a patterned fourth semiconductor zone 4 of the second conduction type is arranged between the first semiconductor zone 11 and the third semiconductor zone 13, which fourth semiconductor zone can be constructed in the same way as a patterned fourth semiconductor zone 4 explained on the basis of the previous exemplary embodiments. In the present case, the patterned fourth semiconductor zone 4 has portions 40, 41, 42 which are arranged at a distance from one another in the first lateral direction r1. A portion 125 of the second semiconductor zone 12 is respectively arranged between adjacent portions from among the portions 40, 41, 42.

In order to feed to the patterned fourth semiconductor zone 4 in the illustrated off state of the planar diode an electrical potential lying between the electrical potential of the first semiconductor zone 11 and the electrical potential of the third semiconductor zone 13, a potential control structure is provided which includes a zener diode 33, 34, a third electrode 93 and also a ninth semiconductor zone 49 of the second conduction type.

The zener diode 33, 34 includes a thirteenth semiconductor zone 33 of the second conduction type, which together with the second semiconductor zone 12 forms a pn junction. Furthermore, the zener diode 33, 34 includes a fourteenth semiconductor zone 34 of the first conduction type, which is at a distance from the second semiconductor zone 12 and together with the thirteenth semiconductor zone 34 forms the pn junction of the zener diode 33, 34.

The third electrode 93 makes contact with the fourteenth semiconductor zone 34 and transfers the electrical potential present there to the ninth semiconductor zone 49, which is formed as a sinker and which is additionally connected to the portion 40 and thus to the patterned fourth semiconductor zone 4. The doping of the ninth semiconductor zone 49 is chosen in such a way that it is not depleted, at least in a portion located between the third electrode 93 and the layer 18 of the patterned fourth semiconductor zone 4 in the vertical direction v, even at those voltages at which the avalanche breakdown occurs at the pn junction formed between the second semiconductor zone 12 and the third semiconductor zone 13.

In the transition of the planar diode from the illustrated off state to the on state, the potential control structure serves moreover to discharge the patterned fourth semiconductor zone 4 that is charged when the planar diode is in the off state.

While in the exemplary embodiments explained above the ninth semiconductor zone 49 extends approximately as far as the upper edge of the semiconductor layer 18 containing the patterned fourth semiconductor zone 4 and is connected to the portion 40 there, the ninth semiconductor zone 49 in the exemplary embodiment in accordance with FIG. 14 extends by way of example over the entire height of the semiconductor layer 18. In general, in this case and in other components, however, it suffices for the ninth semiconductor zone 49 to make contact with the patterned fourth semiconductor zone 4, for example the portion 40 thereof.

The planar diode illustrated has moreover a seventh electrode 97 and an eighth electrode 98, which are in each case optional and formed as field plates. The seventh electrode 97 and the eighth electrode 98 are in each case at a distance from the semiconductor body 100 and electrically insulated from the latter by the dielectric layer 27. The seventh electrode 97 is connected to the first electrode 91. The seventh electrode 97 can be arranged for example in the vertical direction v above the geometrical location at which the pn junction between the second semiconductor zone 12 and the third semiconductor zone 13 leads to the surface 101 of the semiconductor body 100. Proceeding from the geometrical location, the seventh electrode 97 can extend in a direction of the lateral edge 103. The eighth electrode 98 is connected to the third electrode 93 and, proceeding from the latter, extends in a direction of the lateral edge 103. When the planar diode is in the off state, the seventh electrode 97 and/or by the eighth electrode 98 ensure that a maximum permissible gradient of the electrical potential for an edge termination is complied with.

In the case of the arrangement in accordance with FIG. 14, a first diode 81 is furthermore illustrated, which can be provided to the zener diode 33, 34. The first diode 81 is connected between the third semiconductor zone 13 and the patterned fourth semiconductor zone 4 in such a way that it is reverse-biased when the component is in the off state. For this purpose, as illustrated by way of example in the arrangement in accordance with FIG. 14, the anode of the first diode 81 can be electrically connected to the first electrode 91 and the cathode of the first diode 81 can be electrically connected to the third electrode 93.

When the zener diode 33, 34 is dispensed with, the doping of the semiconductor zones 33 and 34 can be replaced by a weak doping of the first conduction type. When the zener diode 33, 34 is dispensed with, moreover, the extension 931 of the third electrode 93 which penetrates through the dielectric layer 27 is unnecessary.

The exemplary embodiment in accordance with FIG. 15 illustrates a vertical section through a planar diode which, apart from the configuration of the third semiconductor zone 13, can be constructed in the same way as the planar diode explained with reference to FIG. 14. In the case of the planar diode in accordance with FIG. 15, the third semiconductor zone 13 is patterned and has portions 131, 132 which are electrically connected to one another. Contact is made with each of the portions 131, 132 by an extension of the first electrode 91. The third semiconductor zone 13 can have for example a reticulated or lattice-like structure. As an alternative thereto, other structures, e.g., strip-like, meander-like, comb-like or comb-like intermeshing structures, are also conceivable. What is crucial is that the third semiconductor zone 3 pervades the second semiconductor zone 12 sufficiently densely.

FIG. 16 illustrates a vertical section through a planar transistor, the basic construction of which corresponds to that of the planar diode in accordance with FIG. 15. In addition, the planar transistor has a patterned sixth semiconductor zones 16 of the second conduction type, which represents the body zones of the planar transistor. The third semiconductor zone 13, which is likewise patterned and forms the source zone of the transistor, is at a distance from the second semiconductor zone 12, makes contact with the first electrode 91 and together with the third semiconductor zone 13 forms a pn junction.

Gate electrodes 95 are arranged above portions in which the sixth semiconductor zone 16 extends between the second semiconductor zone 12 and the third semiconductor zone 13 as far as the front side 101, which gate electrodes are at a distance from the semiconductor body 100 and are electrically insulated from the latter by using the dielectric 27. As is usual in transistors with a cell structure, the gate electrodes 95 serve for driving individual transistor cells and are electrically conductively connected to one another—not discernible in FIG. 16.

In the same way as in the trench components illustrated in FIGS. 5 and 10, in accordance with the patterned fourth and fifth semiconductor zone 4, 5 provided there, it is also possible, in a planar component such as is illustrated e.g., in FIGS. 14 to 16, to provide between the patterned fourth semiconductor zone 4 and the first semiconductor zone 11 one or a plurality of further patterned semiconductor zones which are at a distance from one another and also from the patterned fourth semiconductor zone 4 and from the first semiconductor zone 11. This is explained by way of example on the basis of a planar transistor in accordance with FIG. 17 with two patterned semiconductor zones 4 and 5.

In contrast to the planar transistor in accordance with FIG. 16, the planar transistor in accordance with FIG. 17 additionally has a p-doped patterned fifth semiconductor zone 5, which is arranged between the first semiconductor zone 11 and the patterned fourth semiconductor zone 4 and is at a distance from the first semiconductor zone 11 and also from the patterned fourth semiconductor zone 4. The patterned fifth semiconductor zone 5 includes portions 50, 51, and also further portions (not illustrated) which are at a distance from one another.

In order to feed to the patterned fourth semiconductor zone 4 in the illustrated off state an electrical potential lying between the electrical potential of the first semiconductor zone 11 and the electrical potential of the patterned fourth semiconductor zone 4, a second potential control structure is provided, which includes a zener diode 36, 37, a fourth electrode 94, and also an eleventh semiconductor zone 59 of the second conduction type.

The zener diode 37, 36 includes an n-doped sixteenth semiconductor zone 36 and also a p-doped seventeenth semiconductor zone 37, which together with the sixteenth semiconductor zone 36 forms the pn junction of the zener diode 36, 37.

The fourth electrode 94 makes contact with the sixteenth semiconductor zone 36 and transfers the electrical potential present there to the eleventh semiconductor zone 59, which is formed as a sinker and which is additionally connected to the portion 50 and thus to the patterned fifth semiconductor zone 5. The doping of the eleventh semiconductor zone 59 is chosen in such a way that it is not depleted, at least in a portion located in the vertical direction v between the fourth electrode 94 and the layer 19 of the patterned fifth semiconductor zone 5, even at those voltages at which the avalanche breakdown occurs at the pn junction formed between the second semiconductor zone 12 and the third semiconductor zone 13.

In the transition of the planar transistor from the illustrated off state to the on state, the second potential control structure serves moreover to discharge the patterned fifth semiconductor zone 5 which is charged when the planar transistor is in the off state.

The planar transistor illustrated has moreover an optional ninth electrode 99, which is connected to the fourth electrode 94 and, proceeding from the latter, extends in a direction of the lateral edge 103. The ninth electrode 99 is formed as a field plate, is at a distance from the semiconductor body 100 and is electrically insulated from the latter by the dielectric layer 27. As part of an edge termination of the transistor, the ninth electrode 99 together with the seventh and eighth electrode 97 and 98, respectively, ensures that a maximum permissible gradient of the electrical potential which is required for an edge termination is complied with.

The first diode 81 illustrated in FIGS. 15 to 17, which diode can be provided to the zener diode 33, 34, corresponds to the first diode 81 in accordance with FIG. 14, such that the statements in respect thereof are correspondingly applicable.

The arrangement in accordance with FIG. 17 additionally illustrates a second diode 82, which can be provided to the zener diode 36, 37. The second diode 82 is connected between the patterned fourth semiconductor zone 4 and the patterned fifth semiconductor zone 5 in such a way that it is reverse-biased when the component is in the off state. For this purpose, as is illustrated by way of example in the arrangement in accordance with FIG. 17, the anode of the second diode 82 can be electrically connected to the third electrode 93 and the cathode of the second diode 82 can be electrically connected to the fourth electrode 94.

When the zener diode 36, 37 is dispensed with, the doping of the semiconductor zones 36 and 37 can be replaced by a weak doping of the first conduction type. Moreover, when the zener diode 36, 37 is dispensed with, the extension 941 of the fourth electrode 94 which penetrates through the dielectric layer 27 is unnecessary.

In the components illustrated in the exemplary embodiments above, including the methods explained, the dopings can also be interchanged, that is to say that p-doped semiconductor zones are replaced by n-doped semiconductor zones and n-doped semiconductor zones are replaced by p-doped semiconductor zones. In association with this, p-doping dopants must be replaced by n-doping dopants and n-doping dopants must be replaced by p-doping dopants and the signs of the voltages present at the component must be interchanged. Furthermore, in the case of diodes, anode and cathode are to be interchanged. Moreover, it is possible for all the embodiments explained on the basis of the examples above also to be analogously applied to any other components having a second semiconductor zone 12 formed as a drift zone, provided that this is not ruled out by the respective type of the component.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor component arrangement comprising an active semiconductor component which can assume an on state and an off state and comprising:
   a semiconductor body comprising a first semiconductor zone, a third semiconductor zone, and also a second semiconductor zone of a first conduction type, the second semiconductor zone being arranged between the first semiconductor zone and the third semiconductor zone and being formed as a drift zone;

a patterned fourth semiconductor zone arranged in the second semiconductor zone of a second conduction type, which is complementary to the first conduction type;

a first potential control structure, connected to the patterned fourth semiconductor zone and is configured to feed to the patterned fourth semiconductor zone in the off state of the semiconductor component an electrical potential lying between the electrical potential of the first semiconductor zone and the electrical potential of the third semiconductor zone, and/or is connected to the patterned fourth semiconductor zone and is configured to connect the patterned fourth semiconductor zone, upon the semiconductor component being switched on, for discharging the fourth semiconductor zone, to an electrical potential lying between the electrical potential of the first semiconductor zone and the electrical potential of the third semiconductor zone.

2. The semiconductor component arrangement of claim 1, wherein the first potential control structure comprises a voltage divider connected between the first semiconductor zone and the third semiconductor zone.

3. The semiconductor component arrangement of claim 1, wherein the first potential control structure comprises a resistor connected to the first semiconductor zone and to the patterned fourth semiconductor zone.

4. The semiconductor component arrangement of claim 1, wherein the first potential control structure comprises:
   a ninth semiconductor zone of the second conduction type, which is connected to the patterned fourth semiconductor zone; and
   a third electrode, which is applied to the semiconductor body and which is connected to the ninth semiconductor zone.

5. The semiconductor component arrangement of claim 4, wherein the semiconductor component comprises:
   an active component region, wherein the ninth semiconductor zone is arranged outside the active component region.

6. The semiconductor component arrangement of claim 5, wherein the semiconductor component comprises:
   two active component regions, between which the ninth semiconductor zone is arranged.

7. The semiconductor component arrangement of claim 4, wherein the first potential control structure comprises:
   a first diode comprising an anode and a cathode, wherein the anode is connected to the third semiconductor zone and wherein the cathode is connected to the ninth semiconductor zone.

8. The semiconductor component arrangement of claim 4, wherein the first potential control structure comprises:
   a seventh semiconductor zone of the first conduction type, which is connected to the second semiconductor zone and to the third electrode.

9. The semiconductor component arrangement of claim 8, wherein the semiconductor component comprises:
   an active component region, wherein the seventh semiconductor zone is arranged outside the active component region.

10. The semiconductor component arrangement of claim 8, wherein the semiconductor component comprises:
    a first field electrode, arranged between the second semiconductor zone and the seventh semiconductor zone, and electrically insulated from the second semiconductor zone and from the seventh semiconductor zone by means of a dielectric, and which extends into the semiconductor body in a direction of the first semiconductor zone.

11. The semiconductor component arrangement of claim 8, wherein the semiconductor component comprises:
    a second field electrode, which is arranged between the ninth semiconductor zone and the seventh semiconductor zone and is electrically insulated from the ninth semiconductor zone and from the seventh semiconductor zone by means of a dielectric, and which extends into the semiconductor body in a direction of the first semiconductor zone.

12. The semiconductor component arrangement of claim 4, wherein the semiconductor component comprises:
    a lateral edge; and
    a third field electrode, which is arranged between the lateral edge and the ninth semiconductor zone and is electrically insulated from the ninth semiconductor zone by means of a dielectric, and which extends into the semiconductor body in a direction of the first semiconductor zone.

13. The semiconductor component arrangement of claim 4, comprising:
    a patterned fifth semiconductor zone—arranged in the second semiconductor zone—of the second conduction type;
    a second potential control structure, connected to the patterned fifth semiconductor zone and is designed to feed to the patterned fifth semiconductor zone in the off state of the semiconductor component an electrical potential lying between the electrical potential of the first semiconductor zone and the electrical potential of the patterned fourth semiconductor zone, and is connected to the patterned fifth semiconductor zone and is designed to connect the patterned fifth semiconductor zone, upon the semiconductor component being switched on, for discharging the fifth semiconductor zone, to an electrical potential lying between the electrical potential of the first semiconductor zone and the electrical potential of the third semiconductor zone.

14. A semiconductor component arrangement comprising an active semiconductor component which can assume an on state and an off state comprising:
    a semiconductor body comprising a first semiconductor zone, a third semiconductor zone, and also a second semiconductor zone of a first conduction type, the second semiconductor zone being arranged between the first semiconductor zone and the third semiconductor zone and being formed as a drift zone;
    a patterned fourth semiconductor zone—arranged in the second semiconductor zone—of a second conduction type, which is complementary to the first conduction type; and
    a resistor connected to the first semiconductor zone and to the patterned fourth semiconductor zone.

15. A semiconductor component arrangement comprising an active semiconductor component which can assume an on state and an off state comprising:
    a semiconductor body comprising a first semiconductor zone, a third semiconductor zone, and also a second semiconductor zone of a first conduction type, the second semiconductor zone being arranged between the first semiconductor zone and the third semiconductor zone and being formed as a drift zone;

a patterned fourth semiconductor zone—arranged in the second semiconductor zone—of a second conduction type, which is complementary to the first conduction type; and a seventh semiconductor zone of the first conduction type, which is electrically connected, on the one hand, to the patterned fourth semiconductor zone and, on the other hand, to a first location of the second semiconductor zone, the first location being arranged at a distance from the third semiconductor zone and being arranged between the third semiconductor zone and the patterned fourth semiconductor zone.

16. The semiconductor component arrangement of claim 15, wherein the fourth semiconductor zone comprises the electrical potential of the first location when the semiconductor component is in the off state.

17. The semiconductor component arrangement of claim 15 comprising wherein a thirteenth semiconductor zone of the second conduction type, connected to the patterned fourth semiconductor zone and together with the seventh semiconductor zone forms a pn junction.

18. The semiconductor component arrangement of claim 17 comprising wherein a fourteenth semiconductor zone of the first conduction type, connected to the patterned fourth semiconductor zone and together with the thirteenth semiconductor zone forms a pn junction.

19. The semiconductor component arrangement of claim 15 comprising wherein a patterned fifth semiconductor zone of the second conduction type, arranged between the patterned fourth semiconductor zone and the first semiconductor zone in the second semiconductor zone.

20. The semiconductor component arrangement of claim 19 comprising wherein a tenth semiconductor zone of the first conduction type, connected to the patterned fifth semiconductor zone and, to a second location of the second semiconductor zone, the second location being at a distance from the third semiconductor zone and being arranged between the patterned fourth semiconductor zone and the patterned fifth semiconductor zone.

21. The semiconductor component arrangement of claim 20, wherein the tenth semiconductor zone comprises the electrical potential of the second location when the semiconductor component is in the off state.

22. The semiconductor component arrangement of claim 20 comprising wherein a second diode, the anode of which is connected to the patterned fourth semiconductor zone and the cathode of which is connected to the patterned fifth semiconductor zone.

23. A semiconductor component arrangement comprising an active semiconductor component which can assume an on state and an off state and comprising:

a semiconductor body comprising a first semiconductor zone, a third semiconductor zone, and also a second semiconductor zone of a first conduction type, the second semiconductor zone being arranged between the first semiconductor zone and the third semiconductor zone and being formed as a drift zone;

a patterned fourth semiconductor zone arranged in the second semiconductor zone of a second conduction type, which is complementary to the first conduction type;

means for providing a first potential control structure, connected to the patterned fourth semiconductor zone and is designed to feed to the patterned fourth semiconductor zone in the off state of the semiconductor component an electrical potential lying between the electrical potential of the first semiconductor zone and the electrical potential of the third semiconductor zone.

* * * * *